(12) United States Patent
Rossi et al.

(10) Patent No.: US 8,577,305 B1
(45) Date of Patent: Nov. 5, 2013

(54) CIRCUITS AND METHODS FOR GENERATING OSCILLATING SIGNALS

(75) Inventors: Paolo Rossi, Pavia (IT); Sang Won Son, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 558 days.

(21) Appl. No.: 12/358,955

(22) Filed: Jan. 23, 2009

Related U.S. Application Data

(63) Continuation-in-part of application No. 12/235,333, filed on Sep. 22, 2008.

(60) Provisional application No. 60/974,296, filed on Sep. 21, 2007.

(51) Int. Cl.
*H04B 1/40* (2006.01)

(52) U.S. Cl.
USPC ............... 455/76; 455/296; 455/80; 455/333; 455/323; 455/20; 455/37; 455/38; 455/78; 455/101; 455/132; 327/117; 327/115

(58) Field of Classification Search
USPC ............... 455/76, 78, 20, 101, 132, 296, 500, 455/562.1, 80, 333, 323, 260, 427, 424, 37, 455/38, 39, 84, 414
See application file for complete search history.

(56) References Cited

U.S. PATENT DOCUMENTS

| | | | |
|---|---|---|---|
| 5,347,234 A | 9/1994 | Gersbach et al. | |
| 5,634,207 A * | 5/1997 | Yamaji et al. | 455/323 |
| 5,847,616 A * | 12/1998 | Ng et al. | 331/57 |
| 5,995,819 A * | 11/1999 | Yamaji et al. | 455/326 |
| 6,167,245 A * | 12/2000 | Welland et al. | 455/260 |
| 6,285,262 B1 * | 9/2001 | Kuriyama | 331/25 |
| 6,438,364 B1 * | 8/2002 | Waite | 455/323 |
| 6,452,458 B1 * | 9/2002 | Tanimoto | 331/57 |
| 6,509,777 B2 * | 1/2003 | Razavi et al. | 327/307 |
| 6,535,037 B2 * | 3/2003 | Maligeorgos | 327/116 |
| 6,650,195 B1 * | 11/2003 | Brunn et al. | 331/177 V |
| 6,741,846 B1 * | 5/2004 | Welland et al. | 455/260 |
| 6,816,718 B2 * | 11/2004 | Yan et al. | 455/317 |
| 7,139,540 B2 * | 11/2006 | Wu et al. | 455/251.1 |
| 7,212,798 B1 | 5/2007 | Adams et al. | |
| 7,286,009 B2 | 10/2007 | Andersen et al. | |
| 7,298,183 B2 * | 11/2007 | Mirzaei et al. | 327/115 |
| 7,310,023 B2 * | 12/2007 | Cha et al. | 331/38 |

(Continued)

OTHER PUBLICATIONS

Mazzanti, Andrea et al., "Analysis and Design of Injection-Locked LC Dividers for Quadrature Generation", IEEE Journal of Solid-State Circuits, vol. 39, No. 9, Sep. 2004, pp. 1425-1433.

(Continued)

*Primary Examiner* — Temesgh Ghebretinsae
*Assistant Examiner* — Md Talukder

(57) ABSTRACT

Embodiments of the present invention may be used to generate oscillating signals. One embodiment of the present invention includes a circuit that receives a differential signal to be divided. The circuit converts the differential signal into an injection signal. The injection signal is coupled to an oscillator, and the oscillator generates an output signal having a frequency that is a fraction of the frequency of the differential input signal. In another embodiment, the present invention includes a MIMO wireless communication system. The MIMO system may use the divider circuit to divide a local oscillator signal with reduced common mode distortion.

23 Claims, 13 Drawing Sheets

(56) References Cited

U.S. PATENT DOCUMENTS

| | | | |
|---|---|---|---|
| 7,319,849 B2* | 1/2008 | Womac | 455/180.1 |
| 7,395,040 B2* | 7/2008 | Behzad | 455/168.1 |
| 7,616,935 B2 | 11/2009 | Fernandez-Corbaton et al. | |
| 7,656,205 B2* | 2/2010 | Chen et al. | 327/115 |
| 7,672,645 B2* | 3/2010 | Kilpatrick et al. | 455/76 |
| 7,689,190 B2 | 3/2010 | Kerth et al. | |
| 8,077,652 B2 | 12/2011 | Thesling | |
| 8,081,038 B2* | 12/2011 | Lee et al. | 331/57 |
| 8,139,670 B1 | 3/2012 | Son et al. | |
| 2003/0148750 A1* | 8/2003 | Yan et al. | 455/305 |
| 2004/0198297 A1* | 10/2004 | Oh et al. | 455/318 |
| 2005/0064840 A1* | 3/2005 | Heydari et al. | 455/323 |
| 2005/0090218 A1* | 4/2005 | Ishida et al. | 455/255 |
| 2006/0049880 A1* | 3/2006 | Rein et al. | 331/74 |
| 2006/0114044 A1* | 6/2006 | Mintchev et al. | 327/261 |
| 2006/0128347 A1 | 6/2006 | Piriyapoksombut et al. | |
| 2006/0223474 A1* | 10/2006 | Yoshizaki et al. | 455/252.1 |
| 2007/0077908 A1* | 4/2007 | Vorenkamp et al. | 455/323 |
| 2007/0142080 A1* | 6/2007 | Tanaka et al. | 455/552.1 |
| 2007/0173286 A1* | 7/2007 | Carter et al. | 455/553.1 |
| 2007/0200622 A1* | 8/2007 | Filoramo et al. | 330/10 |
| 2007/0202814 A1* | 8/2007 | Ono et al. | 455/78 |
| 2007/0264959 A1* | 11/2007 | Carrez | 455/323 |
| 2008/0045162 A1* | 2/2008 | Rofougaran et al. | 455/73 |
| 2008/0111639 A1 | 5/2008 | Ryckaert et al. | |
| 2008/0261552 A1* | 10/2008 | Chung | 455/333 |
| 2008/0272818 A1* | 11/2008 | Ko | 327/280 |
| 2009/0143043 A1* | 6/2009 | Yoshizaki et al. | 455/333 |
| 2009/0280762 A1* | 11/2009 | Park et al. | 455/205 |
| 2009/0321056 A1 | 12/2009 | Ran et al. | |
| 2010/0052796 A1 | 3/2010 | Menkhoff | |
| 2010/0080319 A1 | 4/2010 | Blocher et al. | |
| 2010/0283654 A1 | 11/2010 | Waheed et al. | |
| 2011/0053522 A1* | 3/2011 | Rofougaran et al. | 455/73 |
| 2012/0025921 A1* | 2/2012 | Yang et al. | 331/117 FE |
| 2013/0057344 A1* | 3/2013 | Touzard et al. | 330/252 |

OTHER PUBLICATIONS

"Final Office Action", U.S. Appl. No. 12/487,425, (May 3, 2012), 9 pages.

"Non-Final Office Action", U.S. Appl. No. 12/235,333, (Jun. 28, 2011), 16 pages.

"Non-Final Office Action", U.S. Appl. No. 12/487,425, (Jan. 12, 2012), 7 pages.

"Notice of Allowance", U.S. Appl. No. 12/235,333, (Nov. 15, 2011), 5 pages.

"Notice of Allowance", U.S. Appl. No. 12/487,425, Jul. 26, 2013, 9 pages.

* cited by examiner

US 8,577,305 B1

CIRCUITS AND METHODS FOR GENERATING OSCILLATING SIGNALS

CROSS REFERENCE TO RELATED APPLICATIONS

This application is a continuation-in-part of and claims priority to U.S. patent application Ser. No. 12/235,333, entitled "Modular MIMO Transceiver Architecture", filed on Sep. 22, 2008, the entire disclosure of which is incorporated herein by reference, and which is based on and claims priority to U.S. Provisional Patent Application Ser. No. 60/974,296, entitled "A Fully-Integrated Dual-Band 3Tx3R MIMO Transceiver in 90 nm CMOS" which was filed on Sep. 21, 2007, the entire disclosure of which is incorporated herein by reference.

FIELD OF TECHNOLOGY

One aspect of the present disclosure relates to a modular single-chip dual-band MIMO transceiver. The modular design approach disclosed herein provides a scalable (N×N) dual-band MIMO transceiver suitable for IEEE 802.11n WLAN applications. Another aspect of the present invention relates to generating oscillating signals in wireless electronic circuits and to dividing such signals, and in particular, to injection-locking frequency divider circuits and methods that may be used in a wireless system.

BACKGROUND

The demand for high speed wireless networking is rapidly increasing. High speed wireless networks are desired for both enterprise and consumer applications. As high speed wireless networks evolve and become more ubiquitous, there is a constant demand for higher throughput and longer range.

IEEE 802.11n is a wireless networking standard that addresses these needs. IEEE 802.11n employs multiple-input multiple-output (MIMO) transceiver technology to improve performance. MIMO transceivers allow multiple independent spatial data streams to be transmitted or received simultaneously over the same spectral channel of bandwidth. Within a MIMO transceiver each data stream requires a discrete antenna and its own RF processing chain. In order to achieve low costs, low power consumption and a small form factor, an integrated multi-transceiver approach is desired. A unique feature of IEEE 802.11n is that it allows great flexibility in the number and configuration of the spatial data streams in order to meet various system requirements.

Typical MIMO transceivers include a local oscillator for generating a local oscillator signal which is distributed to transceiver blocks located elsewhere on an integrated circuit chip. In order to reduce the form factor of the MIMO transceiver chip, the transceiver blocks are typically arranged adjacent to or as near as possible to the local oscillator. For example, a 2Tx2R MIMO transceiver may include a pair of transceiver blocks symmetrically placed on either side of the local oscillator so that the local oscillator signal may be conveniently provided to both transceiver blocks. MIMO transceivers with a greater number of spatial channels, such as 3Tx3R or 4Tx4R MIMO transceivers, may have transceiver blocks arranged in a more circular or semi-circular pattern around the local oscillator in order to receive the local oscillator signal directly from the local oscillator.

A problem with the existing design approach is that it is not easily scalable. Significant design changes are required to the chip floor plan if it is desired to add an additional spatial channel or otherwise alter the configuration or capacity of the MIMO transceiver. Additionally, the irregular placement of the transceiver blocks in current MIMO transceiver designs make path matching for the separate spatial channels difficult. What is more, each additional transceiver block requires at least 4 additional pins for interfacing the transmit (Tx) and receive (Rx) signals between the transceiver chip and the baseband circuitry of the WLAN system in which the MIMO transceiver is installed. The additional pins for larger MIMO transceivers further complicate the design requirements of a single chip MIMO transceiver.

A new scalable design approach toward single chip MIMO transceivers is desired. Such a new design approach should allow MIMO transceivers of substantially any size to be produced without significant redesign requirements. Such a design approach should also provide adequate path matching between Tx and Rx signal path and provide adequate separation between Tx ports of the same frequency. An improved MIMO transceiver should also reduce the number of pins required to interface the transceiver with the WLAN baseband circuitry.

Mobile communication devices and the evolution of the internet have increased the demand on wireless communication bandwidth. Multiple-input multiple-output (MIMO) is one example technology which is used to sustain a higher data bandwidth. MIMO, like other technologies, require synthesis and processing of high frequency signals such as, for example, local oscillator ("LO") signals that may be used to up-convert or down-convert a carrier frequency. Frequency dividers may be utilized to create additional signals having different frequencies to facilitate this process.

FIG. 1A illustrates a prior art frequency divider 100 used to create an oscillating signal. Frequency divider 100 includes series connected D-flip flops 101 and 102. A clock input 103 provides an input to frequency divider 100. Frequency divider 100 utilizes input 103 to produce $V_{out}$ at one-half the frequency of input 103.

FIG. 1B illustrates an input waveform 104 and an output waveform 105 corresponding to the prior art frequency divider 100 of FIG. 1A. Input waveform 104 corresponds to the input clock 103 of FIG. 1A. Output waveform 105 corresponds to $V_{out}$ of FIG. 1A. Period T2 is twice as long as T1, and therefore, the frequency of output waveform 105 is one-half the frequency of input waveform 104.

FIG. 1C illustrates example circuit 120 using source coupled logic (SCL) to implement a D-flip flop in a frequency divider. Frequency divider 120 is useful in some applications, but has some major disadvantages. For example, frequency divider 120 has a high power consumption, has a limited output swing, does not drive capacitive loads well, and may have an asymmetric output waveform. The high power consumption creates a problem with battery life in mobile wireless solutions. The limited output swing may limit the implementation in low voltage technologies. Additionally, the circuit may require additional buffering to improve capacitive drive capability. The asymmetric output waveform may introduce unwanted additional frequencies which may interfere with the transmitter and receive channels of the system.

FIG. 1D illustrates a prior art injection-locking frequency divider 140. An injection current 147 is a current signal having a frequency component which is used to create $V_{out}$ 149. The output frequency of $V_{out}$ 149 may be one-half the frequency of $I_{inj}$ 147. While this implementation is also useful in some applications, it also has several disadvantages. For example, the injection current in frequency divider 140 may be highly sensitive to interference from other signals on the same integrated circuit. In particular, power amplifiers (PAs)

from other portions of an integrated chip may contribute signals into the ground plane of the integrated circuit. These signals may interfere with 147 and cause the circuit to lock to the wrong frequency. This phenomenon is sometimes referred to as injection pulling caused by a power amplifier or other circuit and may be particularly problematic on integrated circuits with multiple power amplifiers such as a MIMO system. Additionally, frequency divider 140 may also be susceptible to common mode problems. In particular, frequency divider 140 may develop a common mode output at the same frequency as the injection signal.

Thus, there is a need for improved techniques for generating oscillating signals in a wireless communication system, and in particular, to improved frequency divider circuits that may be used in such applications.

SUMMARY

Embodiments of the present disclosure relate to a scalable single-chip N×N dual-band MIMO RF transceiver module. The transceiver includes a frequency synthesizer for generating a local oscillator signal used to modulate baseband signals that are to be transmitted by the transceiver and demodulate RF signals received by the transceiver. The transceiver further includes a plurality of transceiver hocks. Each transceiver block is adapted to independently transmit and receive wireless signals. The transceiver blocks are arranged in a line or row adjacent the frequency synthesizer. A first transceiver block immediately adjacent the frequency synthesizer receives the local oscillator signal directly from the frequency synthesizer. The first transceiver block uses the local oscillator signal to modulate and demodulate signals that are transmitted and received by the first transceiver block. The first transceiver block includes a local oscillator signal repeater. The local oscillator signal repeater receives the local oscillator signal, amplifies it and provides it to the next adjacent transceiver block. This process is repeated until the local oscillator signal has been distributed to each transceiver block in the MIMO RF transceiver.

Thus, an embodiment of a modular MIMO RF transceiver comprises a frequency synthesizer generating a local oscillator signal, and a plurality of transceiver blocks. One or more of the transceiver blocks includes a local oscillator signal repeater. The plurality of transceiver blocks are arranged sequentially from the frequency synthesizer. A local oscillator signal repeater associated with a first transceiver block nearest the frequency synthesizer receives the local oscillator signal from the frequency synthesizer, amplifies the local oscillator signal and outputs the repeated local oscillator signal to a next transceiver block. The modular MIMO RF transceiver may comprise, for example, 3×3 MIMO RF transceiver.

Another embodiment provides a transceiver for use in a modular MIMO RF transceiver system. In this embodiment the transceiver includes a local oscillator signal repeater that receives a local oscillator signal, amplifies the local oscillator signal and outputs the local oscillator signal. A transmitter within the transceiver transmits a received baseband signal at an RF frequency derived from the local oscillator signal. Similarly, a receiver within the transceiver receives an RF signal and down converts the signal to a baseband signal by mixing the received signal with the local oscillator signal. The transceiver module may be adapted to operate in dual frequency bands, based on first and second local oscillator signals.

Yet another embodiment provides a single chip dual band MIMO transceiver. The dual band transceiver includes a frequency synthesizer that generates first and second local oscillator signals. A first transceiver block adjacent the frequency synthesizer receives the first and second local oscillator signals. The first transceiver block is adapted to transmit a first Tx signal in a first frequency band corresponding to the first local oscillator signal and a second Tx signal in a second frequency band corresponding to the second local oscillator signal. The first transceiver block is further adapted to receive a first Rx signal in the first frequency band and a second Rx signal in the second frequency band. The first transceiver block includes a first signal repeater and a second signal repeater. The first signal repeater is adapted to receive the first local oscillator signal from the frequency synthesizer and output the first local oscillator signal to a second adjacent transceiver block. The second signal repeater is adapted to receive the second local oscillator signal from the frequency synthesizer and output the second local oscillator signal to the adjacent transceiver block. The second transceiver block receives the first and second local oscillator signals from the first transceiver block. The second transceiver block is adapted to transmit a third transmit signal in the first frequency band and a fourth transmit signal in the second frequency band. The second transceiver block is further adapted to receive a third received signal in the first frequency band and a fourth received signal in the second frequency band.

Still another embodiment provides a scalable MIMO transceiver system. The scalable MIMO transceiver system includes a frequency synthesizer generating a local oscillator signal and a plurality of transceiver blocks arranged in a row adjacent the frequency synthesizer. A plurality of local oscillator signal repeaters are associated with the plurality of transceiver blocks. The local oscillator signal is provided to a first transceiver block in the plurality of transceiver blocks for modulating baseband signals to be transmitted by the first transceiver block with a carrier signal having a frequency based on the local oscillator signal, and demodulating signals received by the first transceiver block in a frequency band determined by the local oscillator signal. A first local oscillator signal repeater associated with the first transceiver block receives the local oscillator signal from the frequency synthesizer and forwards the local oscillator signal to a second transceiver block in the plurality of transceiver blocks. The second transceiver block similarly modulates baseband signals to be transmitted by the second transceiver block with a carrier signal having a frequency based on the local oscillator signal, and demodulates signals received by the second transceiver block in a frequency band determined by the local oscillator signal.

In another embodiment, the present invention includes a method for use in a MIMO. Accordingly, a method of providing a modular MIMO transceiver is disclosed. The method includes providing a frequency synthesizer for generating a local oscillator signal and providing a plurality of transceiver blocks that include local oscillator signal repeaters. The method next calls for sequentially arranging the plurality of transceiver blocks in a row adjacent the frequency synthesizer. When the transceiver blocks are so arranged, the method calls for providing the local oscillator signal from the frequency synthesizer to a first transceiver block immediately adjacent the frequency synthesizer and repeating the local oscillator signal using the local oscillator signal repeater included with the first transceiver block. The method then calls for providing the repeated local oscillator signal to a second transceiver block immediately adjacent the first transceiver block.

Furthermore, embodiments of the present invention may be used to generate oscillating signals. One embodiment of the present invention includes a circuit that receives a differential signal to be divided. The circuit converts the differential signal into an injection signal. The injection signal is coupled to an oscillator, and the oscillator generates an output signal having a frequency that is a fraction of the frequency of the differential input signal. In another embodiment, the present invention includes a MIMO wireless communication system. The MIMO system may use the divider circuit to divide a local oscillator signal with reduced common mode distortion.

In one embodiment, the present invention is a circuit including an oscillator, a load, and a differential injection circuit. The differential injection circuits have a differential input coupled to receive a differential input signal having a first frequency, a first output coupled to the load, and a second output coupled to the oscillator to provide a first injection signal to the oscillator. The oscillator provides a differential output signal having a second frequency which is a fraction of the first frequency of the differential input signal.

In some embodiments, the second frequency of the differential output signal is one-half the first frequency of the differential input signal.

In some embodiments, the oscillator locks to a fractional frequency of the first injection signal.

In some embodiments, the circuit may include an impedance coupled between the oscillator and a reference voltage for reducing common-mode signal components at the output of the oscillator. In one embodiment, the impedance is a resistor, such as an integrated resistor. In other embodiments, the impedance is a transistor, which may be biased to provide impedance.

In some embodiments, the differential injection circuit comprises a first transistor and a second transistor. A control terminal of the first transistor is coupled to receive a first component of the differential input signal and a control terminal of the second transistor is coupled to receive a second component of the differential input signal. A first terminal of the first transistor is coupled to a first terminal of the second transistor (e.g., common sources). Additionally, a second terminal of the first transistor is coupled to the load and a second terminal of the second transistor is coupled to the oscillator.

In some embodiments, the oscillator comprises cross-coupled transistors each having a source coupled to an output of the differential injection circuit to receive the first injection signal and a resonant circuit coupled to the cross-coupled circuit.

In another embodiment, the present invention includes a method comprising receiving a differential input signal to be divided, the differential input signal having a first frequency, converting the differential input signal into an injection current having the first frequency, coupling the injection current to an input of an oscillator, and generating a differential output signal in the oscillator having a second frequency based on the injection current, wherein the second frequency is a fraction of the first frequency of the differential input signal to be divided.

In one embodiment, the second frequency of the differential output signal is one-half the first frequency of the differential input signal.

In one embodiment, the oscillator locks to a fractional frequency of the injection current.

In one embodiment, the method further comprises coupling a current from a reference voltage to the oscillator through an impedance to dampen common mode frequency components and not dampen differential frequency components of the differential output signal.

In another embodiment, the present invention includes a wireless communication system comprising a frequency synthesizer for generating a local oscillator signal, one or more wireless transceivers. Each transceiver comprises a wireless receiver comprising a down-converter, the down-converter receiving a first RF signal modulated at a first frequency and the local oscillator signal, and in accordance therewith, produces a demodulated baseband signal. Each transceiver also comprises a wireless transmitter comprising an up-converter, the up-converter receiving a baseband signal and the local oscillator signal, and in accordance therewith, produces a second RF signal modulated at the first frequency. The frequency synthesizer generates a local oscillator signal having a second frequency for transmission across an integrated circuit, and the local oscillator signal is divided by a fractional value in each transceiver to said first frequency for use in down-converting RF signals and up-converting baseband signals. The wireless communication system may be implemented on an integrated circuit for example.

In some embodiments, the one or more transceivers comprise a plurality of transceivers, and each transceiver is operable in a first and second mode. The frequency synthesizer generates first and second local oscillator signals having different frequencies. In the first mode, at least one transceiver transmits and receives RF signals using the first local oscillator signal, and in the second mode the at least one transceiver transmits and receives RF signals using the second local oscillator signal.

In some embodiments of the wireless communication system, the frequency synthesizer comprises an oscillator, a load, and a differential injection circuit as set forth above having a differential input coupled to receive a differential input signal having a first frequency, a first output coupled to the load, and a second output coupled to the oscillator to provide a first injection signal to the oscillator. The oscillator provides a differential output signal having a second frequency which is a fraction of the first frequency of the differential input signal.

In one embodiment, the present invention includes a circuit comprising means for receiving a differential input signal and generating a differential output signal, the differential output including an injection signal, such as a current. The circuit further includes means for generating an differential output signal in response to the injection signal, the differential output signal having a frequency that is a fraction of the frequency of the differential input signal. The circuit may further include means for loading a second output signal of the differential output signals. In one embodiment, the circuit includes means for generating a resonant oscillating signal in response to the injection current. In one embodiment, the circuit includes means for damping common mode frequency components in the output signal. In one embodiment, the means for damping also provides power to the oscillator. In one embodiment, the means for damping provides an impedance between the oscillator and a reference voltage.

The following detailed description and accompanying drawings provide a better understanding of the nature and advantages of the present invention.

DETAILED DESCRIPTION

Described herein are techniques for processing and dividing oscillating signals in a wireless system. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

The present disclosure relates to a scalable N×N single-chip dual-band MIMO RF transceiver module compatible with the IEEE 802.11n standard for WLAN applications. A modular design approach allows a transceiver of substantially any dimension to be created on a single chip that may be easily integrated with other system components. An embodiment of such a transceiver described herein comprises a 3×3 MIMO RF transceiver supporting three spatial streams and capable of delivering PHY rates up to 450 Mb/s. The 3×3 MIMO transceiver module includes three substantially identical transceiver blocks and a common local oscillator. Each transceiver block includes transmitters and receivers for transmitting and receiving signals in two distinct frequency bands. The transceiver blocks further include local oscillator signal repeaters for receiving the local oscillator signals and forwarding them to subsequent transceiver blocks.

Figure 1A:
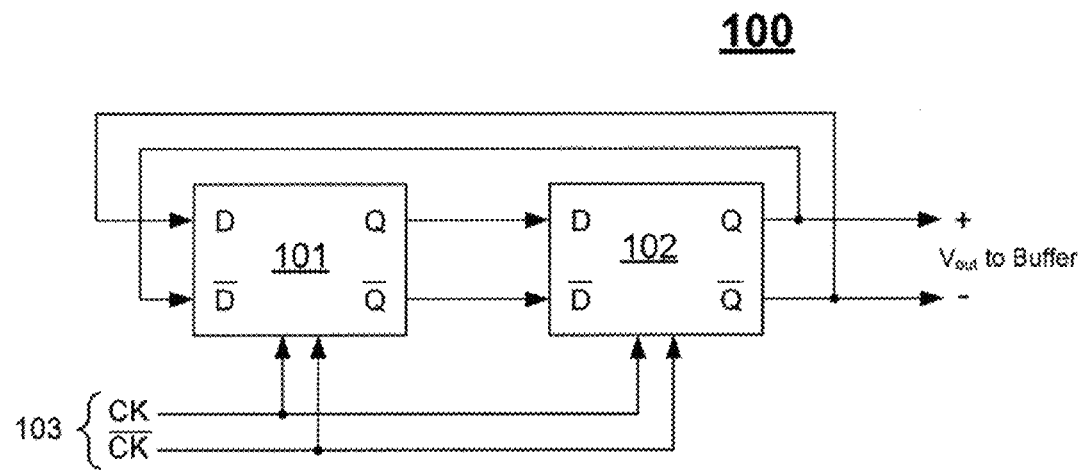
FIG. 1A illustrates a prior art frequency divider used to create a serial clock signal.
Figure 1B:
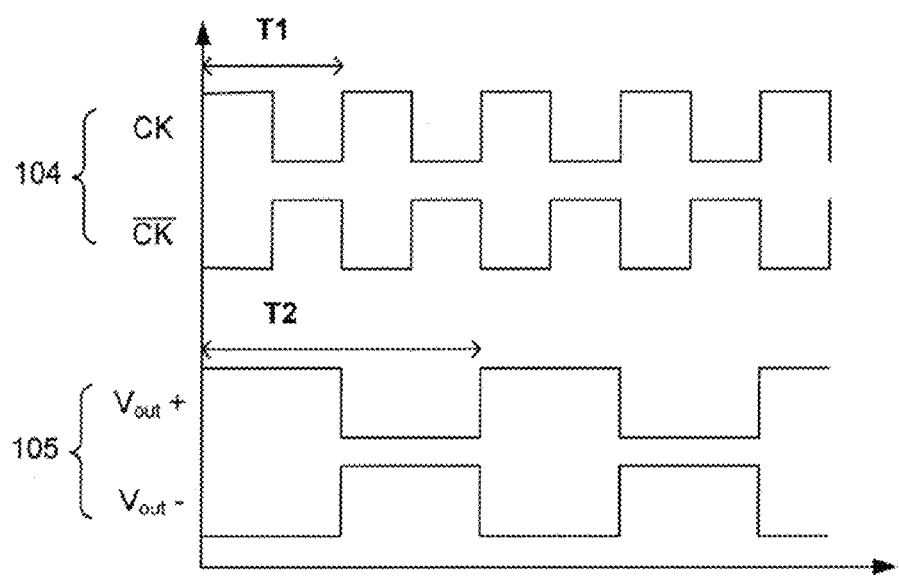
FIG. 1B illustrates an input waveform and an output waveform corresponding to the prior art frequency divider of FIG. 1A
Figure 1C:
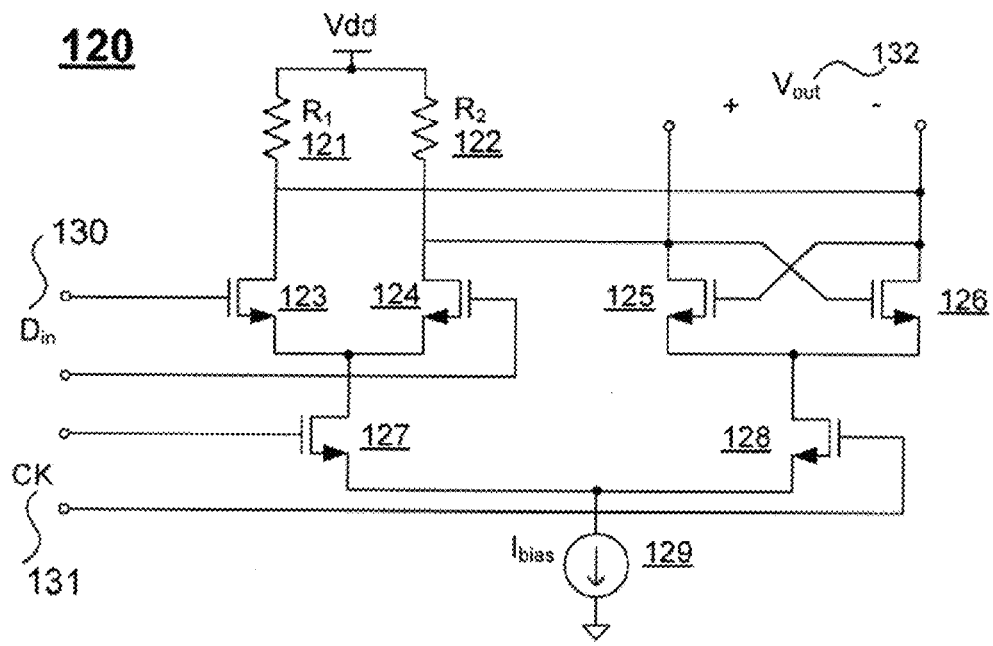
FIG. 1C illustrates a prior art frequency divider circuit.
Figure 1D:
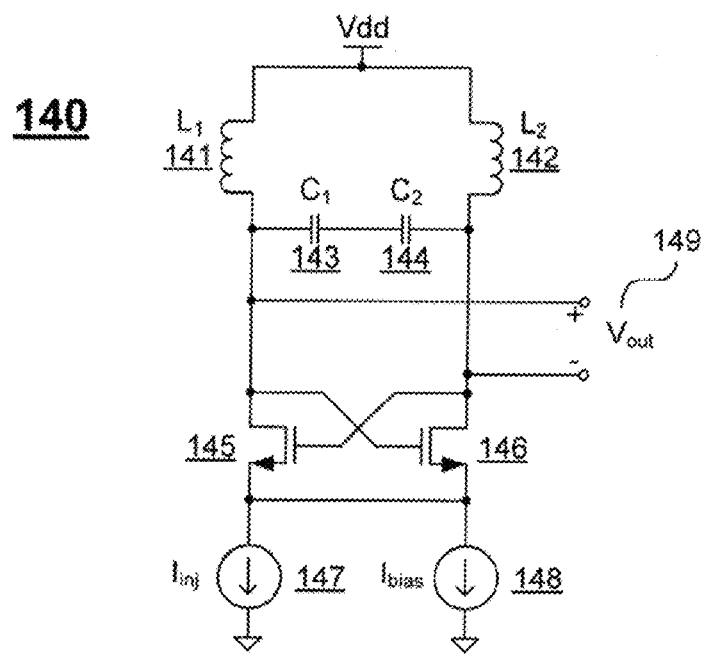
FIG. 1D illustrates another prior art frequency divider circuit.
Figure 2:
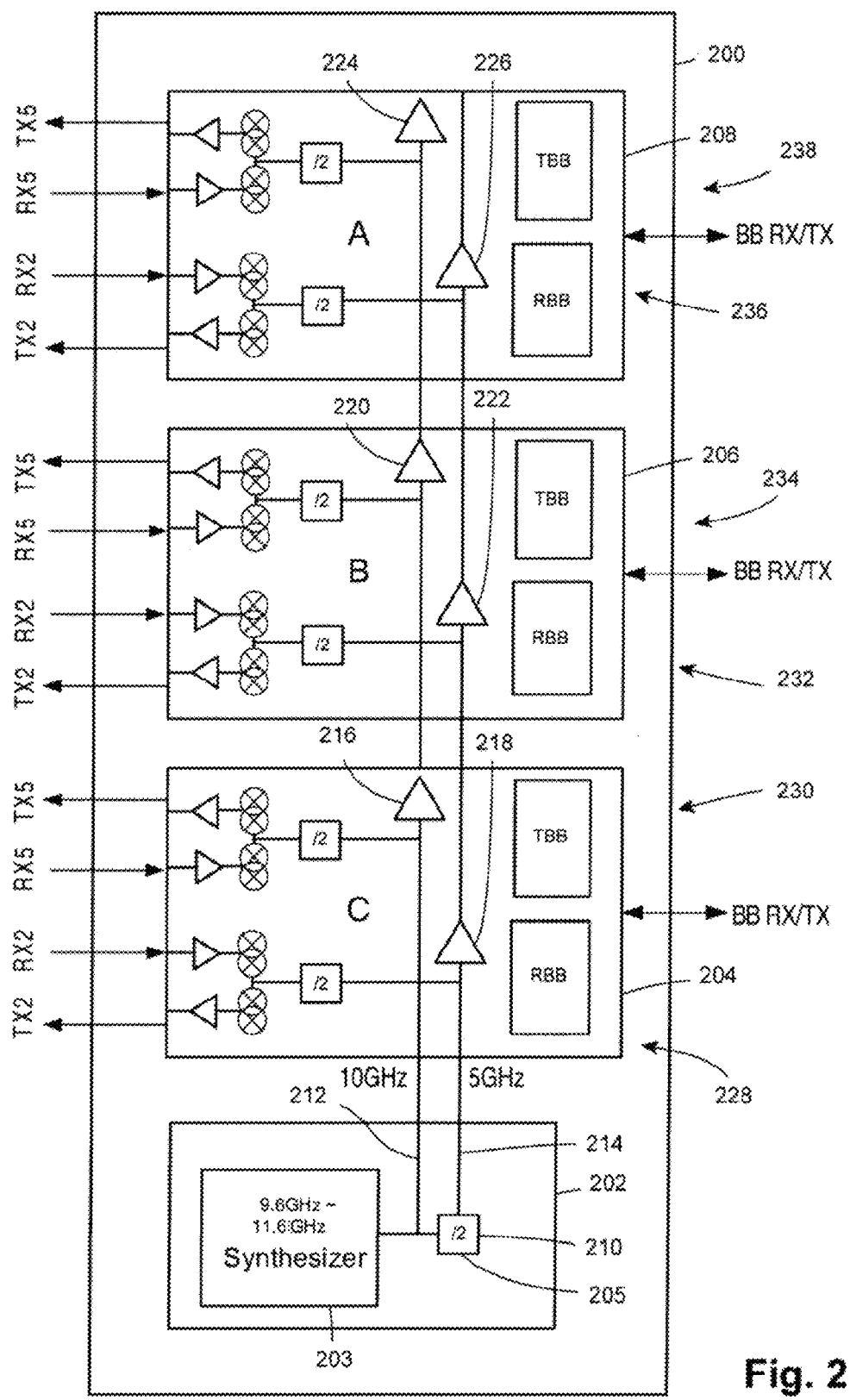
FIG. 2 is a block diagram of a modular 3×3 MIMO RF transceiver.

FIG. 2 is a block diagram of a modular 3×3 MIMO RF transceiver 200. The 3×3 MIMO RF transceiver 200 comprises a local oscillator 202 and three substantially identical transceiver blocks 204, 206, 208. The frequency synthesizer 202 and the three transceiver blocks 204, 206, 208 are arranged on a single integrated circuit chip in the manner shown, with the local oscillator 202 located along a bottom edge of the chip and the transceiver blocks 204, 206, 208, cascaded in ascending order above the local oscillator 202. (The modular MIMO transceiver module 200 is scalable in that a transceiver module of substantially any size may be provided by producing integrated circuit chips having more or fewer identical transceiver blocks arranged in a similar manner.)

The transceiver 200 is a dual band transceiver. Each transceiver block 204, 206, 208 is adapted to transmit and receive RF signals in two distinct frequency bands. According to an embodiment, the transceivers 204, 206, 208 are adapted to transmit and receive RF signals in a first frequency band from 4.915 GHz to 5.825 GHz and a second frequency band from 2.412 GHz to 2.484 GHz. For convenience these two frequency bands will simply be referred to as a 5 GHz band and a 2.5 GHz band. For optimal performance the local oscillator 202 generates a pair of phase-synchronized local oscillator signals 212, 214 that are provided to the transceiver blocks 204, 206, 208 for modulating and demodulating the transmit (Tx) and receive (Rx) signals. The local oscillator signals 212, 214 are distributed to the transceiver modules at approximately twice the corresponding channel frequency. Accordingly, the local oscillator 202 generates local oscillator signals 212, 214 of approximately 5 GHz and 10 GHz.

The local oscillator 202 comprises a frequency synthesizer 203 that generates a 10 GHz local oscillator signal 212. The 10 GHz signal is actually in the frequency range from approximately 9.6 GHz-11.64 GHz. For convenience the first local oscillator signal 212 is referred to as the 10 GHz signal, though one will realize that this is a nominal value which may fall anywhere in the 9.6 GHz-11.6 GHz frequency band. To cover the required frequency range, the frequency synthesizer 203 employs a pair of voltage controlled oscillators (VCOs). These are followed by a dual-input single-output VCO buffer to generate the 10 GHz local oscillator signal 212. The local oscillator 202 includes a divide-by-two frequency divider 205 which divides the frequency of the 10 GHz local oscillator signal 212 approximately in half to obtain the second 5 GHz local oscillator signal 214. Again, the frequency of this second local oscillator signal will fall within a range of frequencies, in this case, 4.8 GHz-5.8 GHz, however, for convenience it is simple referred to as a 5 GHz local oscillator signal. The most straightforward technique for frequency division employs source coupled logic (SCL) dividers. Due to large capacitive loading, however, this solution is not well suited for the present application. To satisfy the power consumption requirements, and provide an efficient MIMO RF transceiver, an injection locking frequency divider (ILFD) may be is adopted.

In the embodiment shown in FIG. 1, a divide by 2 ILFD 210 divides the 10 GHz local oscillator signal 212 to generate the 5 GHz local oscillator signal 214. Providing two local oscillator signals 212, 214 increases the potential frequency range of the MIMO transceiver. Typically only one local oscillator signal will be active at a time, depending on the operating mode of the MIMO transceiver. As shown in FIG. 2, the first and second local oscillator signals 212, 214 are input to the first transceiver block 204. The first transceiver block 204 uses the local oscillator signals 212, 214 to modulate signals that are to be transmitted by the first transceiver block 204 and to demodulate signals that are received by the first transceiver block 204. In addition to transmitter and receiver portions, the first transceiver block 204 includes first and second local oscillator signal repeaters 216, 218. The first and second local oscillator signal repeaters 216, 218 receive the first and second local oscillator signals 212, 214 from the frequency synthesizer and amplify them prior to forwarding them on to the second transceiver block 206. Current-mode local oscillator repeaters may be employed in each transceiver block 204, 206, 208 to achieve the maximum possible bandwidth. In a current-mode local oscillator repeater, the local oscillator signal received from the frequency synthesizer 202 or from the previous transceiver block is passed through a common-gate amplifier to convert the signal back to voltage mode locally, where the current mode signal is amplified and passed on to the next transceiver block. The repeater amplitude is calibrated to ensure the same performance for each transceiver.

Like the first transceiver block 204, the second transceiver block 206 also uses the first and second local oscillator signals 212, 214 to modulate and demodulate signals that are to be transmitted by and which are received by the second transceiver block 206. The second transceiver block 206 similarly includes first and second local oscillator signal repeaters 220, 222. The first and second local oscillator signal repeaters 220, 222 receive the first and second local oscillator signals 212, 214 from the first transceiver block 204, amplify them, and forward them to the third transceiver block 208.

Again, like the first and second transceiver blocks 204, 206, the third transceiver block 208 uses the first and second local oscillator signals 212, 214 to modulate and demodulate signals that are to be transmitted by and which are received by the third transceiver block 208. The third transceiver block 208, however, may or may not include first and second local oscillator signal repeaters 224, 226. In this case, where the transceiver 200 comprises a 3×3 MIMO RF transceiver, there is no need for the local oscillator signal repeaters in the third transceiver block 208, since the first and second local oscillator signals need not be forwarded to a fourth transceiver block. For the sake of uniformity and improved scalability, however, the third transceiver block 208 may include first and second local oscillator signal repeaters 224, 226 as shown in FIG. 2, even when they may not actually used. In this case, the 3×3 MIMO transceiver 200 of FIG. 2 could be readily expanded to a 4×4 MIMO RF transceiver by simply adding an additional transceiver block to the chip without modifying the third transceiver block in any way.

The layout of the MIMO RE transceiver 200 has a number of advantages. The linear arrangement of the transceiver modules 204, 206, 208 provides significant physical separation between the Tx Ports of each transceiver block so that separate Tx signals of the same frequency but output by the different transceiver blocks do not interfere with one another. The linear arrangement of the transceiver modules also improves the path matching characteristics of the MIMO RF transceiver 200. What is more, the modular design approach is easily scalable in that MIMO RF transceivers of different sizes may be developed and manufactured without significant redesign requirements.

Figure 3:
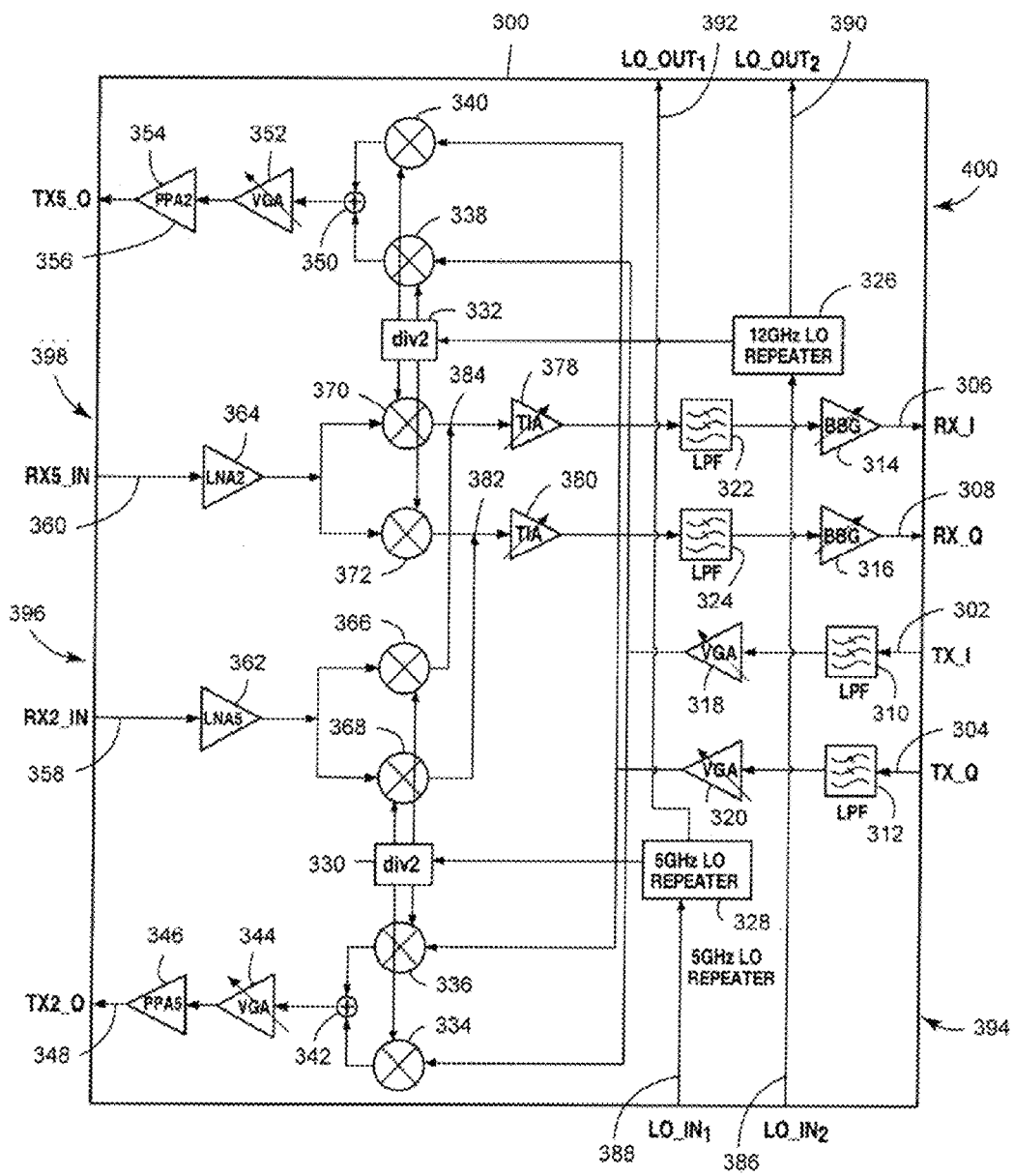
FIG. 3 is a block diagram of a transceiver block for use in a modular transceiver such as that shown in FIG. 2.

A detailed block diagram of a transceiver block 300 is shown in FIG. 3. The transceiver block 300 may be one of the transceiver blocks 204, 206, 208 in the 3×3 MIMO transceiver 200 of FIG. 2, or the transceiver may be part of some other sized or differently arranged transceiver. The transceiver block 300 includes first and second transmitter portions 394, 400, and first and second receiver portions 396, 398. Both the transmitter portions 394, 400 and the receiver portions 396, 398 employ a direct-conversion architecture with local oscillator signals operating at twice the carrier frequency.

The transceiver block is operable at multiple frequencies. The block includes two repeaters for receiving two different frequency local oscillator ("LO") signals for up-converting and down-converting signals received by and transmitted from the system. A first repeater 326 receives a 12 GHz signal and a second repeater 328 receives a 5 GHz signal. Repeater 326 receives the 12 GHz signal and outputs the signal on a first signal line LO_OUT2 to be use by other circuitry such as another transceiver. Repeater 326 also includes an output coupled through divider 332 to up-coverters 338 and 340 and down-converters 370 and 372. The divided version of the LO signal is used for modulating signals to be transmitted and demodulating received signals. Similarly, repeater 328 receives the 5 GHz signal and outputs the signal on a first signal line LO_OUT1 to be use by other circuitry such as another transceiver. Repeater 328 also includes an output coupled through divider 330 to up-coverters 366 and 368 and down-converters 334 and 336. Accordingly, the two divided LO signals at different frequencies are used to send and receive information across two different wireless channels at two different frequencies.

More specifically, the first local oscillator signal repeater 326 receives a first local oscillator signal input 386 and provides a first local oscillator signal output 390. The second local oscillator signal repeater 328 receives a second local oscillator signal 388 and provides a second local oscillator signal output 392. The transceiver 300 includes a first divide-by-two frequency divider 330, and a second divide-by-two frequency divider 332. The transceiver architecture requires the divide-by-two circuits for generating appropriate carrier signals for up-converting baseband transmit signals to the RF operating frequency bands of the dual band transceiver, and down-converting received RF signals to baseband. The divide-by-two circuits may comprise modified versions of a conventional CML static frequency divider in order to achieve higher operating frequencies. One example of a modified CML divider that may be used in some applications is described below.

The first divide-by-two frequency divider 330 divides the frequency of the first local oscillator signal 386 in half to provide a first carrier signal having a frequency equal to one-half the first local oscillator signal frequency. The second divide-by-two frequency divider 332 divides the frequency of the second local oscillator signal 388 in half to provide a second carrier signal having a frequency equal to one-half the second local oscillator signal frequency. As mentioned above, the frequency of the first local oscillator signal is approximately 10 GHz and the frequency of the second local oscillator signal is approximately 5 GHz. Therefore, in the embodiment shown in FIG. 3, the frequency of the first carrier signal output from the first divide-by-two frequency divider will be approximately 5 GHz and the frequency of the second carrier signal output from the second divide-by-two frequency divider will be approximately 2.5 GHz.

The transceiver module 300 receives baseband I/Q signals Tx_I 302 and Tx_Q 304. The signal path for the Tx_I signal 302 includes a third order low-pass filter 310 and a variable gain amplifier 318. The signal path for the Tx_Q signal 304 similarly includes a third order low-pass filter 312 and a variable gain amplifier 320. The first transmitter portion 394 of the transceiver block 300 includes a first signal mixer 334 and a second signal mixer 336. The first signal mixer 334 up-converts the Tx_I baseband signal 302, and the second mixer 336 up-converts the Tx_Q baseband signal 304 to the frequency band corresponding to the first carrier signal output from the first divide-by-two frequency divider 320. A summing junction 342 combines the output from the two mixers 334, 336 and provides the combined signal to a variable gain amplifier (VGA) 344 and a pre-power amplifier (PPA) 346. The output of the pre-power amplifier 346 comprises a 2.5 GHz transmit signal Tx2_O 348.

The second transmitter portion 400 of the transceiver block 300 includes a third signal mixer 338 and a fourth signal mixer 340. The third signal mixer 338 up-converts the Tx_I baseband signal 302 and the fourth mixer 340 up-converts the Tx_Q baseband signal 304 to the frequency band corresponding to the second carrier signal output from the second divide-by-two frequency divider 332. Again, a summing junction 350 combines the output of the two mixers 338, 334 and provides the combined signal to a variable gain amplifier (VGA) 352 and a pre-power amplifier (PPA) 354. The output of the pre-power amplifier 354 comprises a 5 GHz transmit signal Tx5_O 356.

The RF VGAs 344, 352 and PPAs 344, 354 amplify the signals and provide coarse gain adjustments. The transmitters have a gain range of 36 dB in steps of 0.5 dB. In order to achieve high linearity and reduce sensitivity to the bias, the derivative superposition (DS) method may be implemented in the RF amplifier stages. The DS method uses two parallel FETs of different widths and gate biases (one biased at class-C mode, the other at class-A mode) to achieve a composite de transfer characteristic with an extended input range in which the 3rd-order derivative of the combined current is close to zero. Since the DS method is based on small-signal derivations and not optimized for current consumption, it is best used in places where signal strength is relatively small and current consumption is not a major concern, in other words, in the RF VGA and PPA stages. The PPA output stage 346 is still designed as a traditional class-AB amplifier.

The first and second receiver portions 396, 398 of the transceiver block 300 comprise direct conversion receivers. The first receiver portion 396 receives a first receive signal Rx2_IN 358. Rx2_IN has a frequency in the 2.5 GHZ frequency band. The first received signal Rx2_IN 358 is input to a first low-noise amplifier (LNA) 362. Differential LNAs are typically used in many receiver designs, especially in the direct-conversion architecture, to minimize various undesirable effects such as DC offsets. Single-ended LNAs, however, may be chosen to reduce power consumption, reduce the form factor of the transceiver integrated circuit, and reduce the number of RF ports required for each transceiver. Single-ended LNA architecture consists of an inductively degenerated common source stage. The supply voltage of the LNA is heavily regulated to reduce supply noise coupling to the LNA stage 362.

Figure 5:
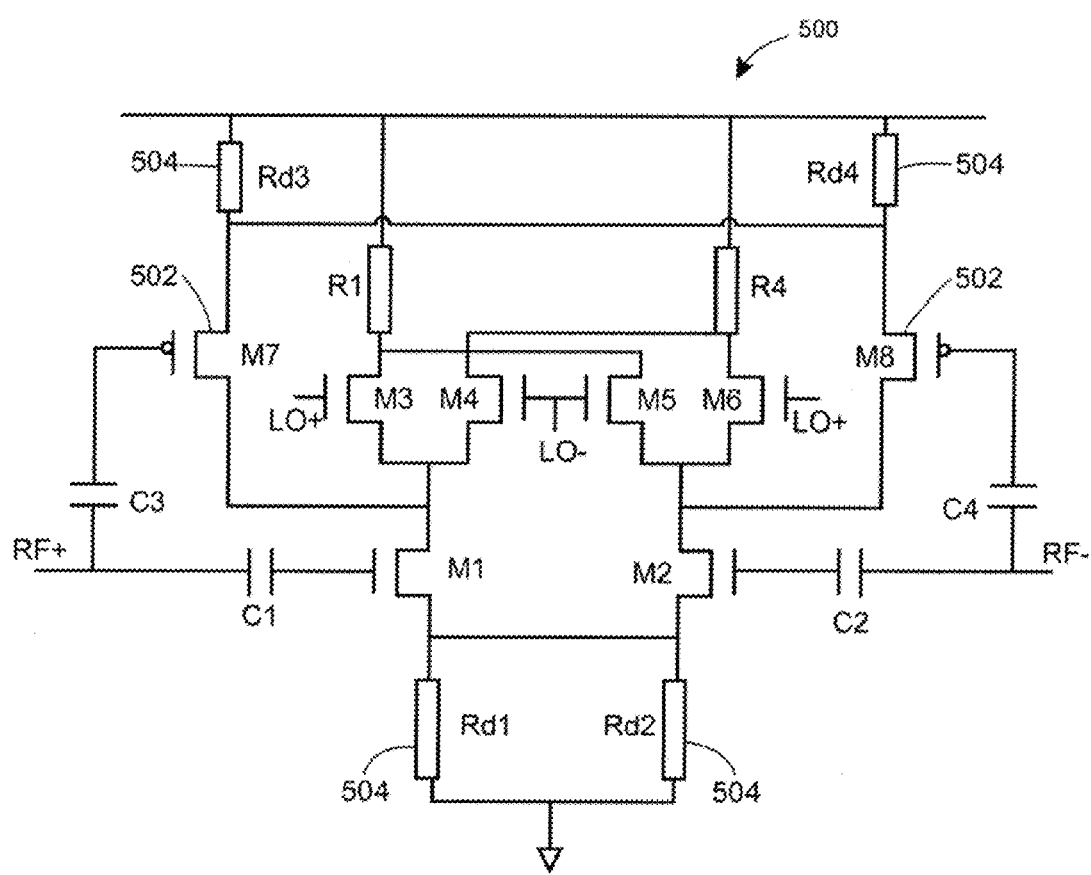
FIG. 5 is a circuit diagram of a double balanced Gilbert Cell signal mixer.

After being amplified in the LNA stage 362, the first received signal is split and provided to fifth and sixth I/Q signal mixers 366, 368. The fifth and sixth I/Q mixers 366, 368 down-convert the received RF signal to the desired baseband, in order to extract the I/Q baseband components of the first receive signal Rx2_IN 358. The down-conversion mixer may comprise a double balanced Gilbert Cell based mixer 500 as shown in FIG. 5. At the mixer input stage, the PMOS device 502 is used as a current-reuse transconductor. The same transistor 502 is also used to achieve a balance between low flicker noise and third order input intercept preferred setpoint (IIP3) performance in the switching core. Common mode degeneration resistors 504 are utilized for both the NMOS and PMOS gain matching branches to improve second order input intercept preferred setpoint (IIP2) and I/Q gain matching.

The second receiver portion 398 of the transceiver block 300 is substantially similar to the first receiver portion 396. The second receiver portion 398 receives a second signal Rx5_IN 360. Rx5_IN 360 has a frequency in the 5 GHZ band. The second received signal Rx5_IN 360 is input to a second low-noise amplifier (LNA) 364. The second receive signal Rx5_IN is then split and provided to seventh and eighth signal mixers 370, 372. The seventh and eight mixers 370, 372 down-convert the received RF signal to the baseband frequency in order to extract the I/Q baseband components of the second receive signal Rx5_IN 360. Again, the down-conversion mixers 370, 372 may each comprise double balanced Gilbert Cell based mixers 500 as shown in FIG. 5.

Returning to FIG. 3, the output of the fifth signal mixer 366 (the Rx_I component of the first received signal) is connected to the output of the seventh signal mixer 370 at circuit node 382. Thus, the output from either the fifth signal mixer 366 or the seventh signal mixer 370 is then input to a first transimpedance amplifier 378. Similarly, the output of the sixth signal mixer 368 (the Rx_Q component of the first received signal) is connected to the output of the eighth signal mixer 372 at a circuit node 384. Thus, the output from either the sixth signal mixer 368 or the eighth signal mixer 372 is input to a second transimpedance amplifier 380. The transimpedance amplifiers improve mixer linearity by reducing the signal swing at the drain of the mixers' switching cores.

The Rx_I signal is filtered by a low-pass filter 322, amplified by a baseband variable gain amplifier 314, and output as the received signal Rx_I 306. Similarly, the Rx_Q signal is filtered by a low-pass filter 324, amplified by a baseband variable gain amplifier 316 and output as the received signal Rx_Q 308. The low pass filters 322, 324 reject blocking signals, and the baseband VGAs 314, 316 fine-tune the gain to the optimal level before digitization. The received error vector magnitude signal (EVM) strongly depends on the signal-to-noise ratio (SNR) and the distortion of the receiver. Signal detectors may be located at various positions in the receiver chain to ensure that the various components are operating within their linearity limits. The gain switching point of the LNAs and LPFs is optimized so that EVM is minimized for a wide input power range.

Figure 4:
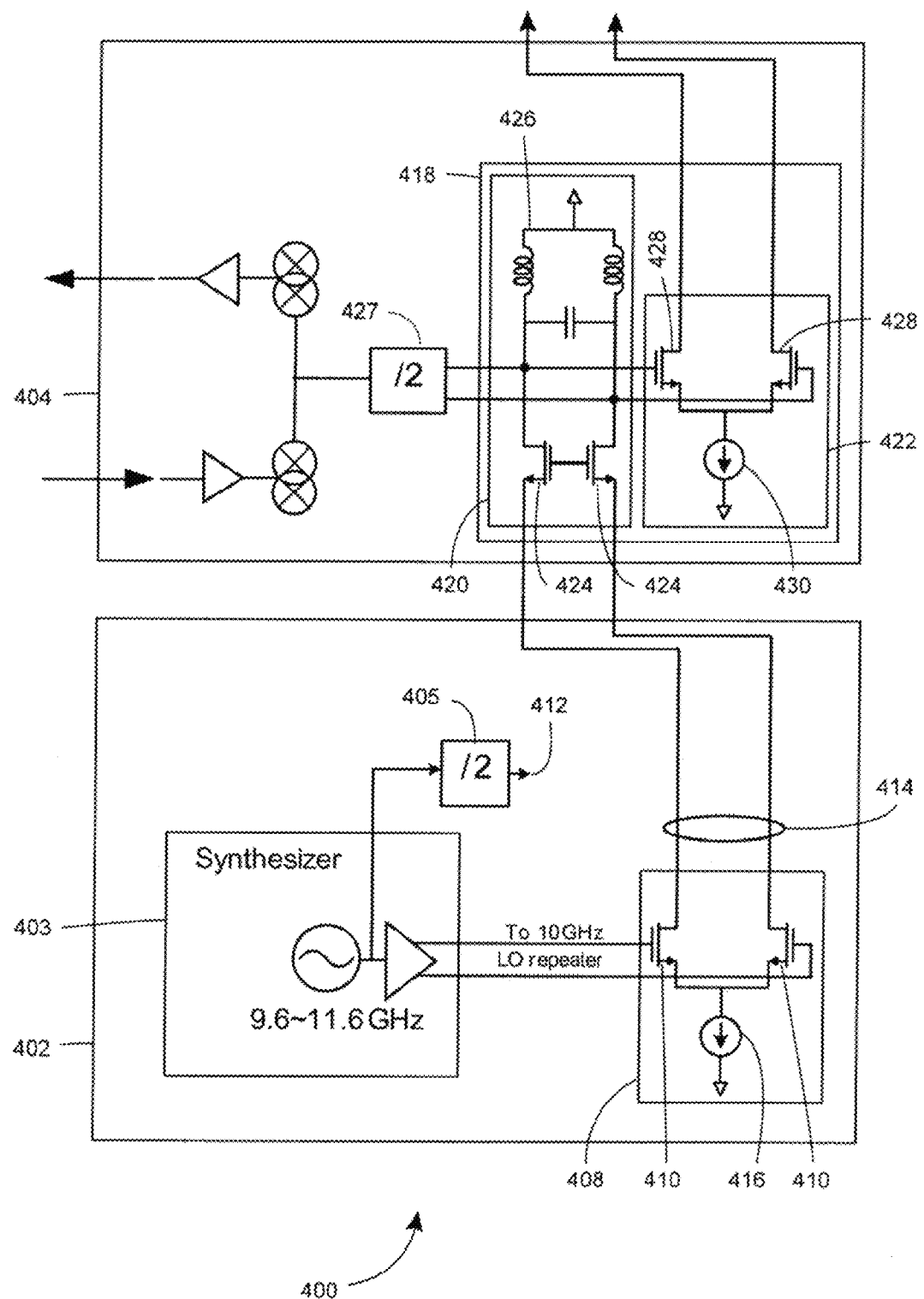
FIG. 4 is a circuit diagram showing circuitry for providing a local oscillator signal and a local oscillator signal repeater.

As mentioned above, the local oscillator signal repeaters in the transceiver blocks 204, 206, 208 of FIG. 2 may comprise current mode repeaters to maximize potential bandwidth. An example of a current mode local oscillator signal repeater is shown in FIG. 4. FIG. 4 shows a modular MIMO transceiver 400 that includes a local oscillator 402 and a transceiver block 404. The modular transceiver 400 may include any number of additional transceiver blocks 404, but for purposes of illustrating a current mode local oscillator signal reater just one transceiver block is shown, with the understanding that the current mode local oscillator signal repeaters in other transceiver blocks will be substantially identical to that shown in the transceiver block 404 in FIG. 4.

The local oscillator 402 includes a frequency synthesizer 403 that generates the first 10 GHz local oscillator signal 412. The local oscillator 402 further includes a divide by 2 frequency divider 405 for generating the second, 5 GHz, local oscillator signal 414. A voltage-to-current mode transconductance stage 408 is shown for converting the 10 GHz local oscillator signal from a voltage signal to a current signal. Although not shown in FIG. 4, a similar transconductance stage is provided for the 5 GHz signal 414 output from the divide by 2 frequency divider 405. The voltage-to-current mode transconductance stage 408 comprises a pair of MOSFET transistors 410 and a current source 412. The drains of the two MOSFET devices 410 are connected in a common drain arrangement with the drains of both MOSFET devices connected to the input of the current source 412. The 10 GHz voltage signal output from the frequency synthesizer is applied to the gates of the two MOSFET devices, the source terminals of the two MOSFET devices 410 provide the 10 GHz current mode local oscillator signal 414 that is provided to the first transceiver block 404.

The 10 GHz local oscillator signal repeater 418 in the first transceiver block 404 includes a common gate amplifier circuit 420, a voltage-to-current mode transconductance stage 422. The common gate amplifier 420 comprises a pair of MOSFET transistors 424 connected in a common gate arrangement, and a tuned LC loading circuit 426, connected to the source terminals of the two MOSFET devices 424. The 10 GHz current mode local oscillator signal 414 is connected to the drains of the two MOSFET, devices 424. The two MOSFET devices 424 and the LC loading circuit 426 convert the 10 GHz current mode local oscillator signal back into a voltage signal. The converted voltage signal is then provided to a frequency divider 427, and is used for upconverting and downconverting signals transmitted and received by the transceiver blocks in FIG. 2, for example. The converted voltage signal is also provided to the voltage-to-current transconductance stage 422 in the same manner that the 10 GHz local oscillator signal generated by the frequency synthesizer 403 was provided to the voltage-to-current transconductance stage 408 of the local oscillator 402. The voltage-to-current transconductance stage 422 of the local oscillator signal repeater 418 is substantially identical to the voltage-to-current mode transconductance stage 408 of the local oscillator 408, including a pair of MOSFET transistors 428 connected in a common drain arrangement with a current source 430. The source terminals of the two MOSFET devices 428 provide the 10 GHz current mode local oscillator signal 412 to the next transceiver block in the modular MIMO transceiver.

The MIMO RF transceiver 200 of FIG. 2 may be capable of transmit and receive I/Q calibration. A baseband single tone may be applied to an input of the transmitter. The resulting RF spectrum of the up-converted tones consists of the main RF tone and the sideband tone from I/Q mismatch. This signal is loop-backed to the receiver and down-converted to baseband using a low IF receiver. The received signal may then be analyzed for I/Q compensation in the digital domain.

In addition to the reduced form factor, scalability, and improved path matching of the MIMO RF transceiver module disclosed herein, the transceiver layout may also be employed to reduce the number of pins required for interfacing the RF transceiver integrated circuit chip with the baseband circuitry of a WLAN-system. A typical RF transceiver block such as transceiver blocks 204, 206, 208 in FIG. 2 requires a total of four pins for receiving a baseband I/Q transmit signal from the WLAN baseband circuitry. These include Tx_I+ and Tx_I− pins for receiving the Tx_I component of the transmit signal, and Tx_Q+ and Tx_Q− pins for receiving the Tx_Q component of the transmit signal. Similarly, a typical RF transceiver block requires four pins for interfacing baseband I/Q signals received by the receiver portion of the transceiver with the baseband circuitry of the WLAN system. These include Rx_I+ and Rx_I− pins for interfacing the Rx_I component of the received signal to the baseband circuitry, and Rx_Q+ and Rx_Q− pins for providing the Rx_Q component of the received signal to the baseband circuitry. Thus, 8 pins total are required for interfacing signals between a single RF transceiver block and the baseband portion of the WLAN circuitry. In the 3×3 transceiver module 200 of FIG. 2 this adds up to a total of 24 pins for interfacing Tx and Rx signals between the transceiver module 200 and the baseband circuitry.

The transceiver blocks 204, 206, 208 cannot transmit and receive signals simultaneously. Therefore, the number of interface pins could be reduced by half by sharing the same set of pins for interfacing both Tx and Rx signals. A multiplexer or other switching mechanism associated with the transceiver may be employed to connect the interface pins to the transmitter portion of the transceiver during a transmitting mode of operation, and to the receiver portion of the transceiver during a receiving mode. Thus, in the transmitting mode, baseband signals from the WLAN circuitry may be applied to the four interface pins associated with the transceiver block as described and transmitted by the transmitting portion of the transceiver. Similarly, in the receiving mode, the multiplexer or other switching mechanism may connect down-converted baseband signals received by the receiver portion of the transceiver block to the same set of interface pins to convey the received signals from the transceiver block to the WLAN baseband circuitry. By sharing pins in this manner, the total number of interface pins in a 3×3 transceiver module may be reduced from 24 to 12.

In order to perform an I/Q calibration loop back test, however, a transceiver block must be able to receive Tx signals from the baseband circuitry, and provide Rx signals to the baseband circuitry simultaneously. In conducting such a test, a single tone signal is generated in the baseband circuitry and is applied to the input of the transmitter. The transmitter up-converts the signal to RF frequency and loopback circuitry couples the transmitted signal back to the receiver. The transceiver down converts the received test signal and provides the baseband signal to the WLAN baseband circuitry, which analyzes the received test signal to determine the amount of I/Q compensation required for satisfactory operation of the communication channel. Unfortunately, performing such a loopback test precludes sharing interface pins between the transmit and receive portions of the transceiver, since the retransmitted signal received by the first transceiver would have to be output to the WLAN baseband circuitry on the same set of pins dedicated to receiving the outbound test signal from the WLAN baseband circuitry.

Figure 6:
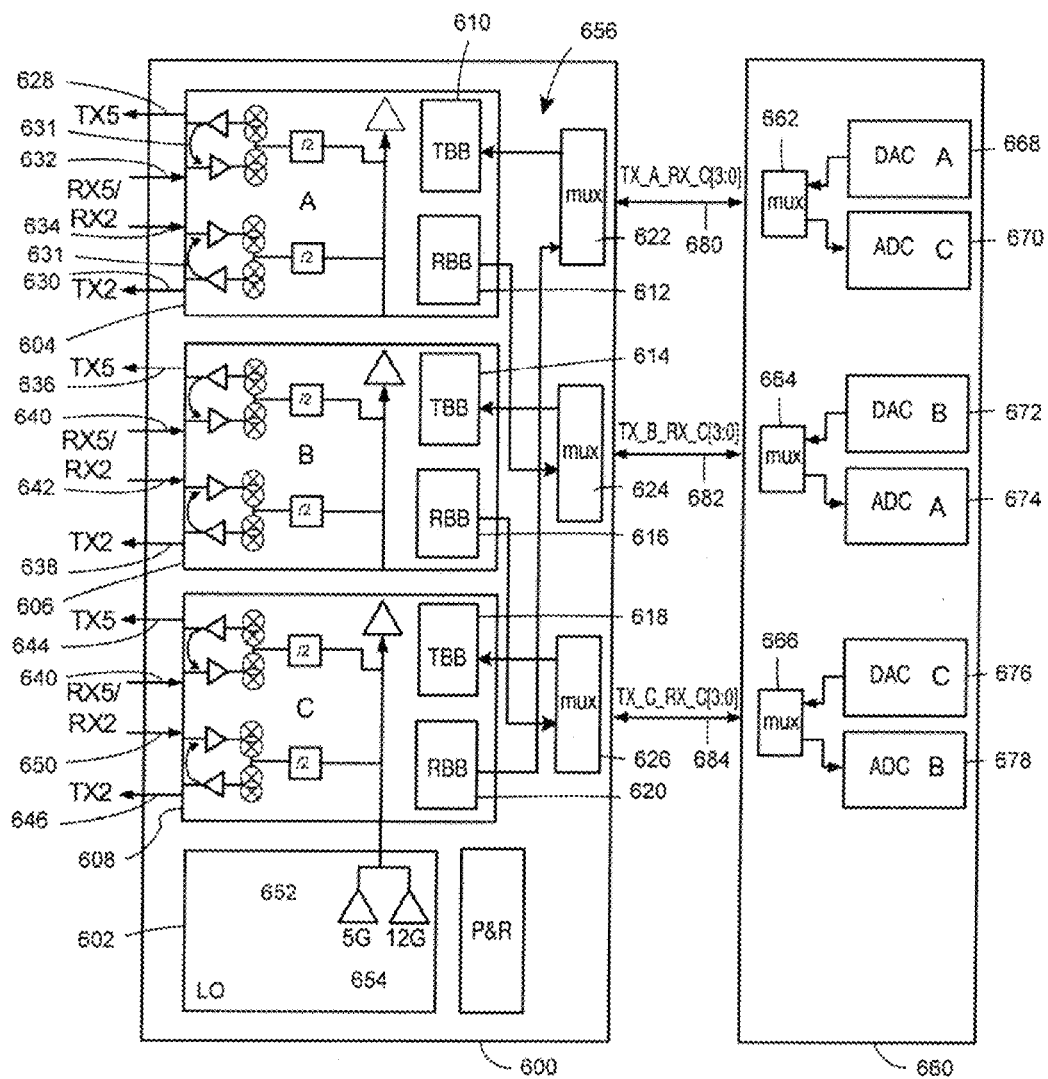
FIG. 6 is a block diagram of a 3×3 MIMO RF transceiver and corresponding WLAN baseband circuitry in which both Tx and Rx signals share common sets of signal interface pins.

This obstacle to sharing interface pins, however, may be surmounted by splitting up and reordering the corresponding transmit and receive functions associated with the plurality of communication sub-channels established by the plurality of transceiver blocks of a multi-channel MIMO RF transceiver module. Such an arrangement is illustrated in FIG. 6. A 3×3 modular MIMO RF transceiver 600 similar to the transceiver module 200 shown in FIG. 2 is provided. The transceiver module 600 includes a frequency synthesizer 602 and three substantially similar transceiver blocks: Transceiver block A 604, Transceiver block B 606, and Transceiver block C 608. Again, the frequency synthesizer provides a pair of local oscillator signals 652, 654 to the transceiver blocks 604, 606, 608 for modulating and demodulating signals transmitted and received by the transceiver blocks 604, 606, 608. The transceiver blocks 604,606,608 comprise dual band transceivers capable of transmitting and receiving signals in two distinct frequency bands. Transceiver block A 604 transmits a first set of 5 GHz and 2.5 GHz Tx signals 628, 630 and receives a first set of 5 GHz and 2.5 GHz Rx signals 632, 634. Transceiver block B 606 transmits a second set of 5 GHz and 2.5 GHz Tx signals 636, 638 and receives a second set of 5 GHz and 2.5 GHz Rx signals 640, 642. Finally, Transceiver block C transmits a third set of 5 GHz and 2.5 GHz Tx signals 644, 646, and receives a third set of 5 GHz and 2.5 GHz Rx signals 648, 650.

For simplicity, the low-pass filters, amplifiers, and other components associated with receiving baseband signals from the WLAN baseband circuitry 660 and for outputting received baseband signals to the WLAN baseband circuitry 660 have been consolidated and are shown simply as transmit baseband blocks (TBB) and receive baseband blocks (RBB). Thus, transceiver block A 604 includes TBB block 610 and RBB block 612. Transceiver block B 606 includes TBB block 614 and RBB block 616. Transceiver block C 608 includes TBB block 618 and RBB block 620. The 3×3 MIMO RF transceiver module 600 further includes three multiplexers 622, 624, 626. The multiplexers 622, 624, 626 switch between transmit and receive modes of operation. In the transmit mode the multiplexers 622, 624, 626 connect Tx signals received from the WLAN baseband circuitry 660 to the TBB blocks 612, 614, 618 associated with the various transceiver blocks 604, 606, 608. In the receive mode, the multiplexers 622, 624, 626 connect down-converted baseband Rx signals from the RBB blocks 612, 616, 620 to the baseband circuitry 660. An internal bus structure 656 on the MIMO RF transceiver 600 integrated circuit chip routes signals between the various TBB blocks 610, 614, 618 and RBB blocks 612, 616, 620 and the multiplexers 622, 624, 626.

The 3×3 MIMO RF transceiver 600 supports three separate communication sub-channels, each associated with one of the transceiver blocks 604, 606, 608. These may be identified as communication sub-channels A, B and C. Each communication sub-channel supports both Tx and Rx signals. Thus, communication sub-channel A supports transmit signals Tx_A which originate in the WLAN baseband circuitry 660 and are provided to the MIMO RF transceiver 600 for transmission to one or more external devices. Communication sub-channel A further supports received signals Rx_A which are received by the MIMO RF transceiver 600 from one or more external devices and provided to the WLAN baseband circuitry 660. Similarly, communication sub-channel B supports transmit signals Tx_B and receive signals Rx_B. Communication sub-channel C supports transmit signals Tx_C and receive signals Rx_C. The WLAN baseband circuitry 660 includes a digital-to-analog converter DAC A 668 for converting digital signals into the analog baseband Tx_A signals for transmission over communication sub-channel A. The WLAN baseband circuitry 660 further includes digital-to-analog converter DAC B 672 for converting digital signals into analog baseband Tx_B signals for transmission over communication sub-channel B. Finally, the WLAN baseband circuitry 660 includes digital-to-analog converter DAC C 676 for converting digital signals into analog baseband Tx_C signals for transmission over communication sub-channel C. Conversely, the WLAN baseband circuitry 660 further includes analog-to-digital converter ADC A 674 for converting analog baseband Rx_A signals received over communication sub-channel A into digital signals, analog-to-digital converter ADC B 678 for converting analog baseband Rx_B signals received over communication sub-channel B into digital signals, and analog-to-digital converter ADC C 676 for converting analog baseband signals Rx_C received over communication sub-channel C into digital signals. The WLAN baseband circuitry 660 further includes first, second and third multiplexers 662, 664, 666. As with the multiplexers 622, 624, 626 in the MIMO RF transceiver module 600, the multiplexers 662, 664, 666 associated with the WLAN baseband circuitry 660 switch between transmit and receive modes of operation. In the transmit mode, the multiplexers 662, 664, 666 connect Tx signals from the digital-to-analog converters 668, 672, 676 to the transceiver module 600. In the receive mode the multiplexers 662, 664, 666 connect baseband Rx signals received by the transceiver to the analog-to-digital converters 670, 674, 678.

The WLAN baseband circuitry 660 interfaces with the MIMO RF transceiver 600 via three distinct signal paths 680, 682, 684. Each signal path 680, 682, 684 comprises four conductors (corresponding to pins on the transceiver integrated circuit chip package) connecting the WLAN baseband multiplexers 662, 664, 666 to the MIMO RF transceiver multiplexers 622, 624, 626. With four conductors, each signal path 680, 684, 686 is capable of carrying one of either a baseband I/Q Tx signal (Tx_I+, Tx_I−, Tx_Q+, Tx_Q−) from the WLAN baseband circuitry 660 to the MIMO RF transceiver 600, or a baseband I/Q Rx signal (Rx_I+, Rx_I−, Rx_Q+, Rx_Q−) from the MIMO RF transceiver 600 to the WLAN baseband circuitry 660. Since the transmit and receive signals share the signal paths 680, 682, 684, only 12 conductors are required to interface the MIMO RF transceiver 600 with the WLAN baseband circuitry 660.

The problem of performing the I/Q calibration loop-back test while sharing the interface connections between both Tx and Rx signals is avoided by routing corresponding Tx and Rx signals from the same transceiver block 604, 606, 608 to separate multiplexers 622, 624, 626 of the MIMO RF transceiver 600, so that an outgoing Tx test signal and the corresponding incoming Rx test signal travel across separate signal paths between the MIMO RF transceiver 600 and the WLAN baseband circuitry 660.

As can be seen in FIG. 6, the internal bus structure 656 of the MIMO RF transceiver module 600 routes outgoing Tx_A signals from the first multiplexer 622 to the TBB block 610 in transceiver block A 604, while incoming Rx_A signals are routed from the RBB block 612 in transceiver block A 604 to the second transceiver multiplexer 624. The first multiplexer 622 is connected to the first communication path 680 between the WLAN baseband circuitry 660 and the transceiver module 600, and the second multiplexer 624 is connected to the second signal path 682 between the WLAN baseband circuitry 660 and the transceiver module 600. Thus, Tx_A signals cross the interface between the WLAN baseband circuitry 660 and the transceiver module 600 over the first signal path 680, while Rx_A signals cross the interface over the second signal path 682. Similarly, outgoing Tx_B signals are routed from the second transceiver multiplexer 624 to the TBB block 614 in transceiver block B 604, while incoming Rx_B signals are routed from the RBB block 616 in transceiver block B 604 to the third transceiver multiplexer 626. As mentioned, the second transceiver multiplexer 624 is connected to the second signal path 684 between the transceiver module 600 and the WLAN baseband circuitry 660. The third multiplexer 626 is connected to the third signal path 684. Thus, Tx_B signals cross the interface between the WLAN baseband circuitry 660 and the transceiver module 600 over the second signal path 682, while Rx_B signals cross the interface over the third signal path 684. Finally, outgoing Tx_C signals are routed from the third transceiver multiplexer 626 to the TBB block 618 of transceiver C 604, while inbound Rx_C signals are routed from the RBB block 620 of transceiver C to the first transceiver multiplexer 622. Thus, Tx_C signals cross the interface between the WLAN baseband circuitry 660 and the transceiver module 600 over the third signal path 684, while Rx_C signals cross the interface over the first signal path 680.

On the WLAN baseband side of the interface, the first WLAN baseband multiplexer 662 is connected to the first signal path 680 between WLAN baseband circuitry and the transceiver module 600. The first WLAN baseband multiplexer 662 switches between connecting Tx_A signals from DAC A 668 to the first signal path 680, and connecting Rx_B signals from the first signal path 680 to ADC C 670. The second WLAN baseband multiplexer 664 is connected to the second signal path 682 and switches between connecting Tx_B signals from DAC B 672 to the second signal path 682, and connecting Rx_A signals from the second signal path 682 to ADC A 674. Finally, the third WLAN baseband multiplexer 666 is connected to the third signal path 684 and switches between connecting Tx_C signals from DAC C 676 to the first signal path, and connecting Rx_B signals from the third signal path 684 to ADC B 678.

During an I/Q calibration loop back test for communication sub-channel A, the first transceiver multiplexer 622 and the first WLAN baseband multiplexer 662 operate in the transmit mode. The second transceiver multiplexer 624 and the second WLAN baseband multiplexer 664 operate in the receive mode. A test signal Tx_A$_{test}$ originates in the WLAN baseband circuitry 660. The test signal Tx_A$_{test}$ is converted to an analog baseband signal by DAC A 668 and provided to the first WLAN baseband multiplexer 662. The WLAN baseband multiplexer 662 connects the Tx_A$_{test}$ signal to the first signal path 680, and the first transceiver multiplexer 622 connects the first signal path 680 to TBB block 610 of transceiver block A 604. Thus, the baseband signal Tx_A$_{test}$ is conveyed from DAC A 608 in the WLAN baseband circuitry 660 to TBB block 610 in transceiver A 604 via the first signal path 680. Transceiver block A 604 transmits the test signal and loopback circuitry 631 couples the transmitted test signal to the receiver portion of transceiver A 604. Transceiver block A 604 receives the looped back test signal as received signal Rx_A$_{test}$ and outputs the received test signal via the RBB block 612. The Rx_A$_{test}$ signal is routed from the RBB block 612 to the second transceiver multiplexer 624. The second transceiver multiplexer 624 connects the received Rx_A$_{test}$ signal to the second signal path 682, and the second WLAN baseband multiplexer 664 connects the second signal path 682 to ADC A 674. Thus, the baseband signal Rx_A$_{test}$ is conveyed from the RBB block 612 in transceiver block A to ADC A 674 in the WLAN baseband circuitry 660 via the second signal path 682. The ADC A 674 digitizes the received Rx_A$_{test}$ signal, and the WLAN baseband circuitry 660 determines the level of I/Q compensation required for communication subchannel A in the digital domain. By routing the received Rx_A$_{test}$ signal back to the WLAN baseband circuitry 660 over a separate signal path, the conflict between the Tx_A$_{test}$ signal and the Rx_A$_{test}$ signal during the loop-back test is resolved.

As described above, the transmit and receive signals associated with the other transceiver blocks 604, 606 are similarly routed to separate multiplexers and thus conveyed across the interface between the transceiver module 600 and the WLAN baseband circuitry 660 by separate interface signal paths. Tx_B signals are routed over the second signal path 682, while Rx_B signals are routed over the third signal path 684. Tx_C signals are routed over the third signal path 684, while Rx_C signals are routed over the first signal path 680. By staggering the performance of the I/Q calibration loop-back tests for each transceiver block 604, 606, 608, the interface pins for each transceiver block may be shared between Tx and Rx signals without interference. Thus, the total number of interface pins for coupling signals between the transceiver module 600 and the WLAN baseband circuitry may be reduced by half.

Figure 7:
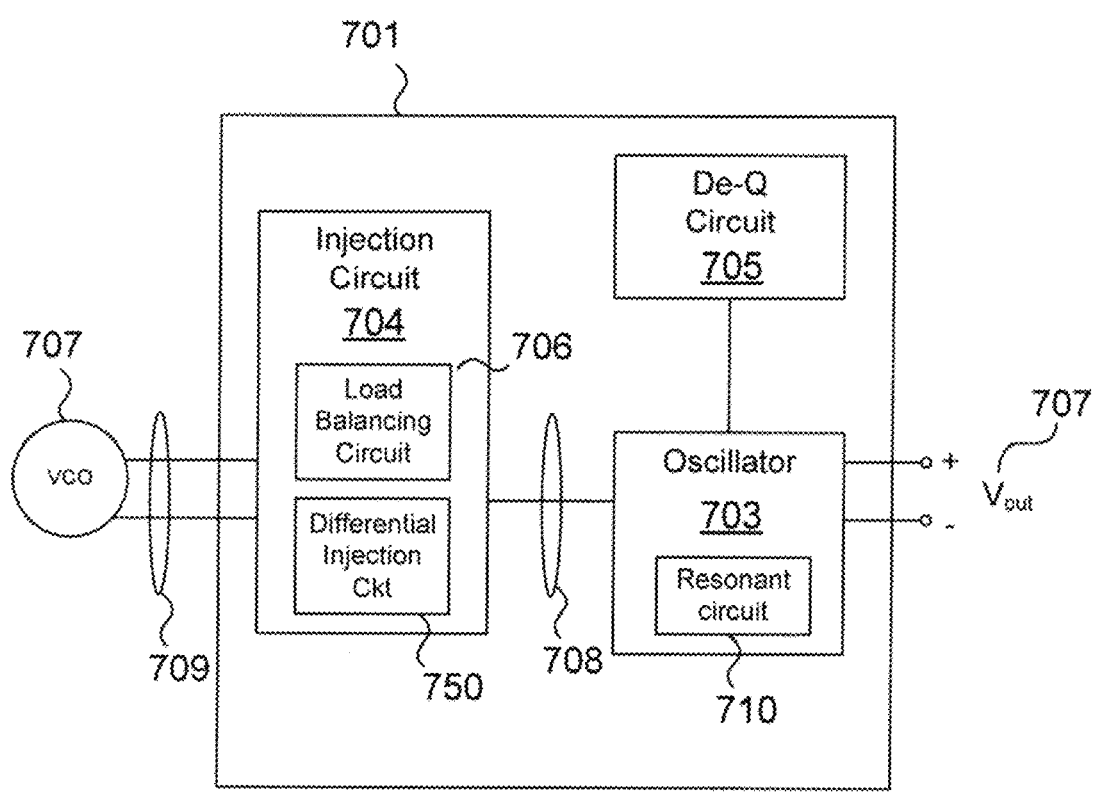
FIG. 7 illustrates a frequency synthesizer according to one embodiment of the present invention.

FIG. 7 illustrates a frequency synthesizer 700 according to one embodiment of the present invention. Frequency synthesizer 700 may be integrated into a communication system implementing a MIMO architecture as described in more detail below, for example. Frequency synthesizer 700 includes an injection-locking frequency divider (ILFD) 701 coupled to accept a differential oscillator signal 709 from voltage controlled oscillator (VCO) 702. ILFD 701 includes injection circuit 704, De-Q circuit 705, and oscillator 703. VCO 702 provides a differential oscillator input signal 709 to injection circuit 704. Injection circuit 704 provides an injection signal 708 to oscillator 703. Oscillator 703 is an injection-locking oscillator which provides a differential output voltage V$_{out}$ 707. The differential output voltage V$_{out}$ 707 may have a frequency which is half the frequency of the differential oscillating signal 709.

Injection circuit 704 receives a differential input signal from the VCO and generates a differential output signal, the differential output signal includes an injection signal (e.g., a current) and another signal. Injection signal 708 has the same frequency as the differential oscillating signal 709. Injection signal 708 may be used to generate an injection current within oscillator 703 that is used to generate a differential output signal having a frequency that is a fraction of the differential input signal frequency as described in more detail below.

The injection circuit 704 may include a load balancing circuit 706 and a differential injection circuit 750 for generating the injection signal 708. Differential injection circuit 750 receives the input signal to be divided as a differential signal and couples an injection signal 708 to oscillator 703. Load balancing circuit 706 may include an impedance which corresponds to the impedance within oscillator 703 so that the outputs of the differential injection circuit are balanced, for example.

The technique provided by differential injection circuit 704 and oscillator 703 allows the frequency synthesizer 700 to be less susceptible to frequency spurs caused by power amplifiers (PAs) or by other sources. For example, the frequency synthesizer 700 may be integrated into a communication circuit that utilizes a plurality of PAs to transmit wireless signals. These PAs may generate spurious signals within the ground plane of the integrated circuit. Each complimentary signal of differential oscillating signal 709 may be influenced in similar measure to the ground interference. In other words, differential signals are less susceptible to common mode distortion. Accordingly, by processing the input signal differentially to create the injection signal, the circuit may reduce susceptibility of the oscillator to common mode components, resulting in reduced common mode signals in output voltage V$_{out}$ 707.

In one embodiment, ILFD 701 may also include a de-Q circuit 705 to further reduce unwanted common mode signal components in the output signal. De-Q circuit 705 may dampen the common mode frequency components within the injection locking oscillator in one embodiment, the de-Q circuit is an impedance coupled between the oscillator and a reference voltage such as the supply voltage. For example, frequency synthesizer 700 may be part of integrated circuit and oscillator 703 may include a differential resonant circuit 710, which may include capacitors and inductors (e.g., an LC tank). The resonant circuit may include unwanted common mode frequency components from the injection signal (e.g., ½ the desired output signal). In some applications, De-Q circuit 705 may be provided to dampen the common mode frequency components, and therefore the quality factor (i.e. Q factor), while not affecting the differential components of the circuit 710 to reduce the common mode signal components at the output.

Figure 8A:
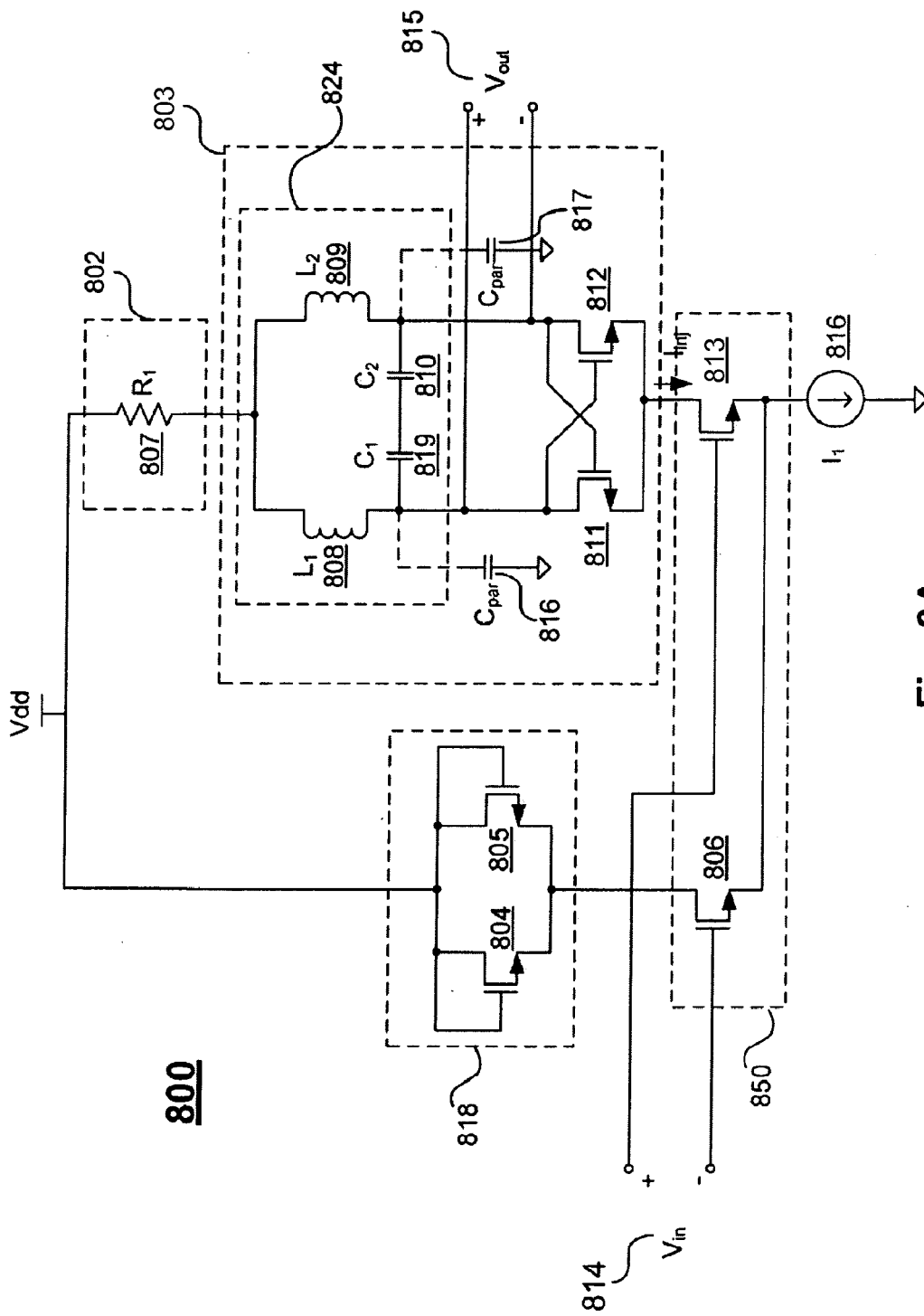
FIG. 8A illustrates a frequency divider according to one embodiment of the present invention.

FIG. 8A illustrates a frequency divider 800 according to one embodiment of the present invention. Frequency divider 800 includes differential injection circuit 850, load balancing circuit 818, de-Q circuit 802, and oscillator 803. Differential injection circuit 850 is coupled to receive differential input signal V$_{in}$ 814. Differential injection circuit 850 receives a differential input signal to be divided and provides an injection signal (I$_{inj}$) to oscillator 803. Accordingly, differential injection circuit 850 provides an example circuit for receiving a differential input signal and generating an injection signal. One output of circuit 850 is coupled to the oscillator 803 and the other output is coupled to load balancing circuit 818. Load balancing circuit provides a load for one output of differential circuit 850. Oscillator 803 receives the injection signal and locks to one-half the signal frequency. De-Q circuit 802 is coupled to provide power to oscillator 803 and to dampen common mode frequency components as described above.

Oscillator 803 provides a differential output signal $V_{out}$ 815 that may have one-half the frequency of the differential input signal $V_{in}$ 814.

Differential injection circuit 850 includes transistors 806 and 813. The control terminal of transistor 806 is coupled to receive one component of differential input signal $V_{in}$ 814 and the control terminal of transistor 813 is coupled to receive the other component of differential input signal $V_{in}$ 814. In this example, load balancing circuit includes transistors 804 and 805. Two transistors 804 and 805 are used to match the main branch path. So 804 and 805 are miming 811 and 812. The drain terminal of transistor 806 is coupled to the source terminal of transistor 804 and the source terminal of transistor 805. The control terminal and the drain terminal of transistor 804 and the control terminal and the drain terminal of transistor 805 are coupled to reference voltage Vdd. The drain terminal of transistor 806 produces a signal (here, a current) that is loaded by transistors 804 and 805. Similarly, the drain terminal of transistor 813 produces the injection signal (here, also a current). In this example, the source terminals of transistors 806 and 813 are coupled to a bias current source 816.

Oscillator 803 includes inductor 808, inductor 809, capacitor 819, capacitor 810, and cross-coupled transistors 811-812. One terminal of inductor 808 and 809 is coupled to receive power from a reference voltage (e.g., a power supply Vdd) through resistor 802, which is described in more detail below. A second terminal of inductor 808 is coupled to one terminal of capacitor 819, the drain terminal of transistor 811 and the control terminal of transistor 812. A second terminal of inductor 809 is coupled to one terminal of capacitor 810, the drain terminal of transistor 812 and the control terminal of transistor 811. The other terminals of capacitor 819 and 810 are coupled together. The source terminal of transistors 811 and 812 are coupled to the drain terminal of transistor 813 to receive the injection signal (i.e., current $I_{inj}$). In this example, the oscillator circuit generates a resonant oscillating signal at a frequency based on the values of the capacitors and inductors and the injection signal.

Frequency divider 800 utilizes differential to single-ended current injection to produce differential output signal $V_{out}$ 815. Transistor 806 and 813 form a differential pair. Differential input signal $V_{in}$ 814 couples to the control terminal of transistor 806 and 813 and steers the current of current source 816 through transistor 806 and transistor 813. Load balancing circuit 818, comprised of transistors 804 and 805, has a controlled impedance relative to the impedance as presented to the drain terminal of transistor 813. In one embodiment, the impedance of circuit 818 may be matched to the impedance of the oscillator to improve the balance of current passing through transistors 806 and 813 such that each component of differential input signal $V_{in}$ 814 contributes proportionally to generating the injection current $I_{inj}$. For instance, the signal provided to the control terminal of transistor 813 may modulate the current $I_t$ to produce $I^{inj}$.

In this example, De-Q circuit 802 is implemented using a resistor 807. Resistor 807 couples current from Vdd to the oscillator 803. Oscillator 803 may include load capacitors 816 and 817 (connected with dashed lines). These capacitances may be input parasitic capacitances of a subsequent circuit stage, for example. Resistor 807 provides a damping effect on common mode frequency components such that a corresponding quality factor (i.e. Q factor) is reduced. Resistor 807 does not dampen the differential frequency components associated with the resonant circuit (i.e. inductor 808, inductor 809, capacitor 819, and capacitor 810) because the node between the inductors is a virtual ground to differential signals in the LC tank. Accordingly, the quality factor associated with the differential resonant circuit remains unchanged. As a result, the common mode frequency components of the output signal are attenuated but the differential frequency components are unchange.

Figure 8B:
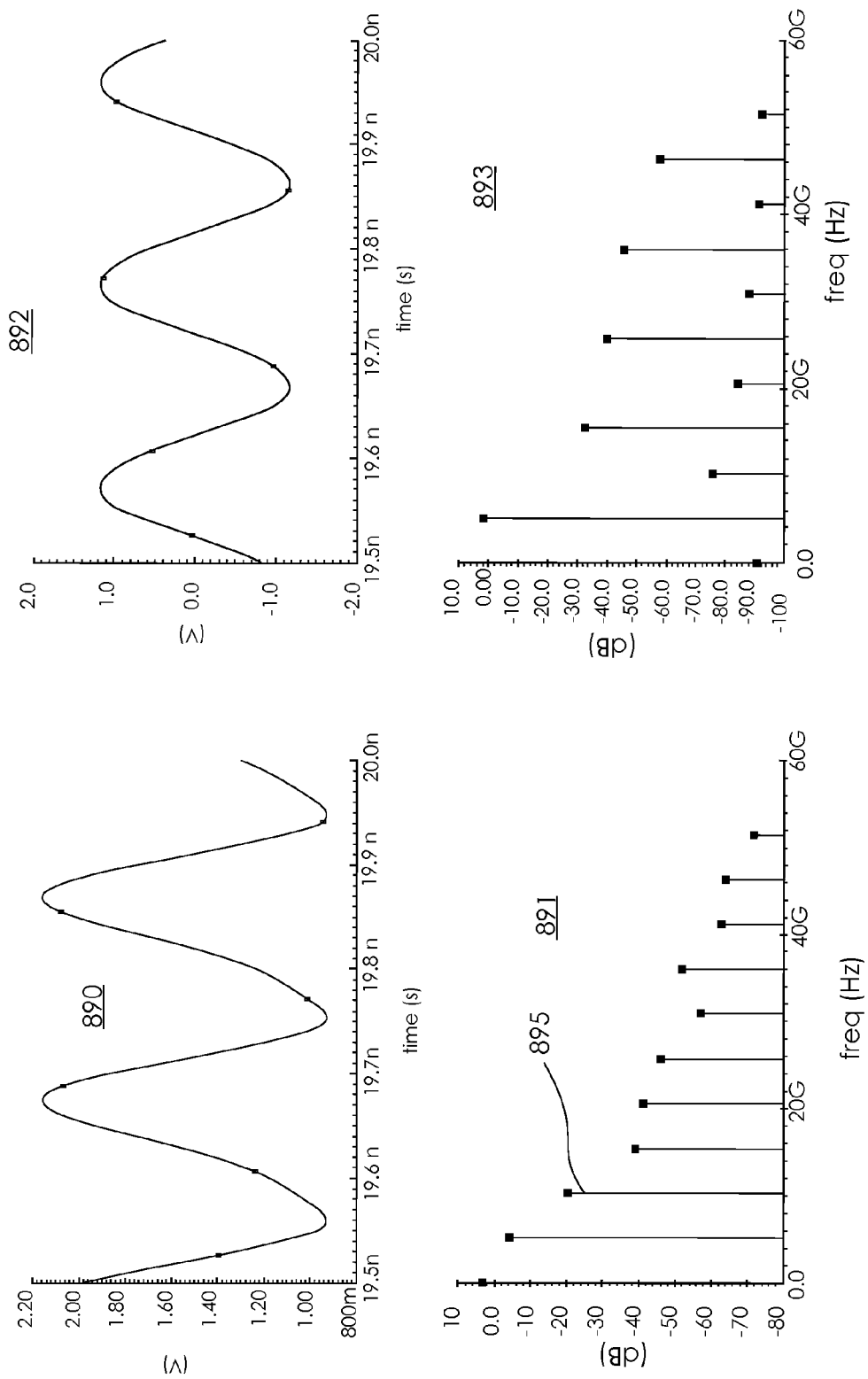
FIGS. 8B-C are plots of the time-domain and frequency-domain performance of frequency dividers.
Figure 8C:
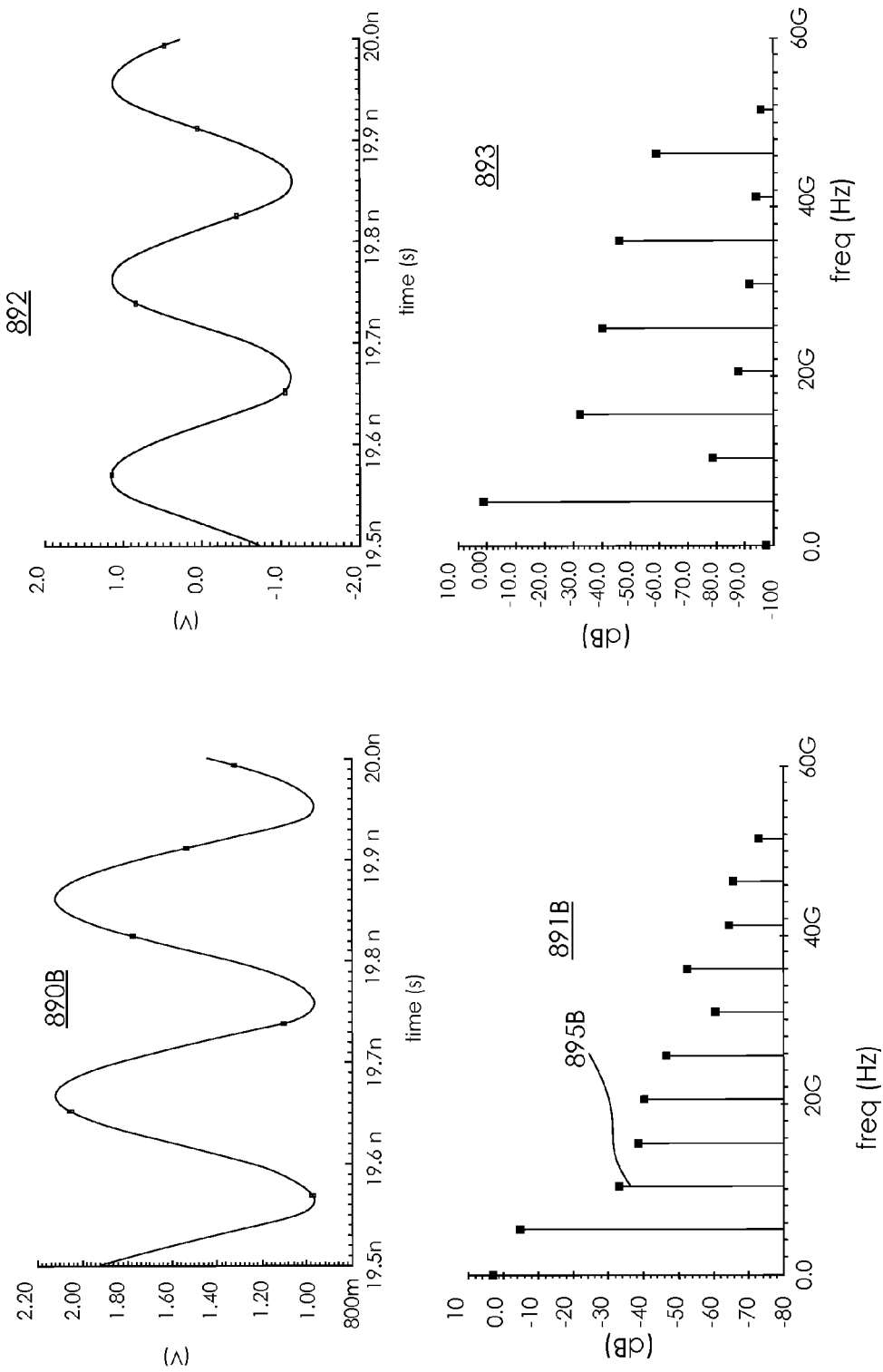

FIGS. 8B and 8C illustrate the improvement in reducing unwanted common mode frequency components. The input frequency for this example is 10.4 GHz and the output frequency is 5.2 Ghz. FIG. 8B shows the waveforms at the output of a prior art injection locked oscillator. FIG. 8B illustrates the single ended (or common mode) time domain waveform 890, common mode frequency domain components 891, differential time domain waveform 892, and the differential frequency domain components 893. As illustrated at 895, the common mode signal includes a strong harmonic 895, which is an unwanted common mode frequency component. FIG. 8C shows the waveforms at the output of a injection locked oscillator of FIG. 8A, FIG. 8C illustrates the single ended (or common mode) time domain waveform 890B, common mode frequency domain components 891B, differential time domain waveform 892B, and the differential frequency domain components 893B. As illustrated at 895B, the common mode harmonic has been reduced by more than 10 dB.

Figure 9:
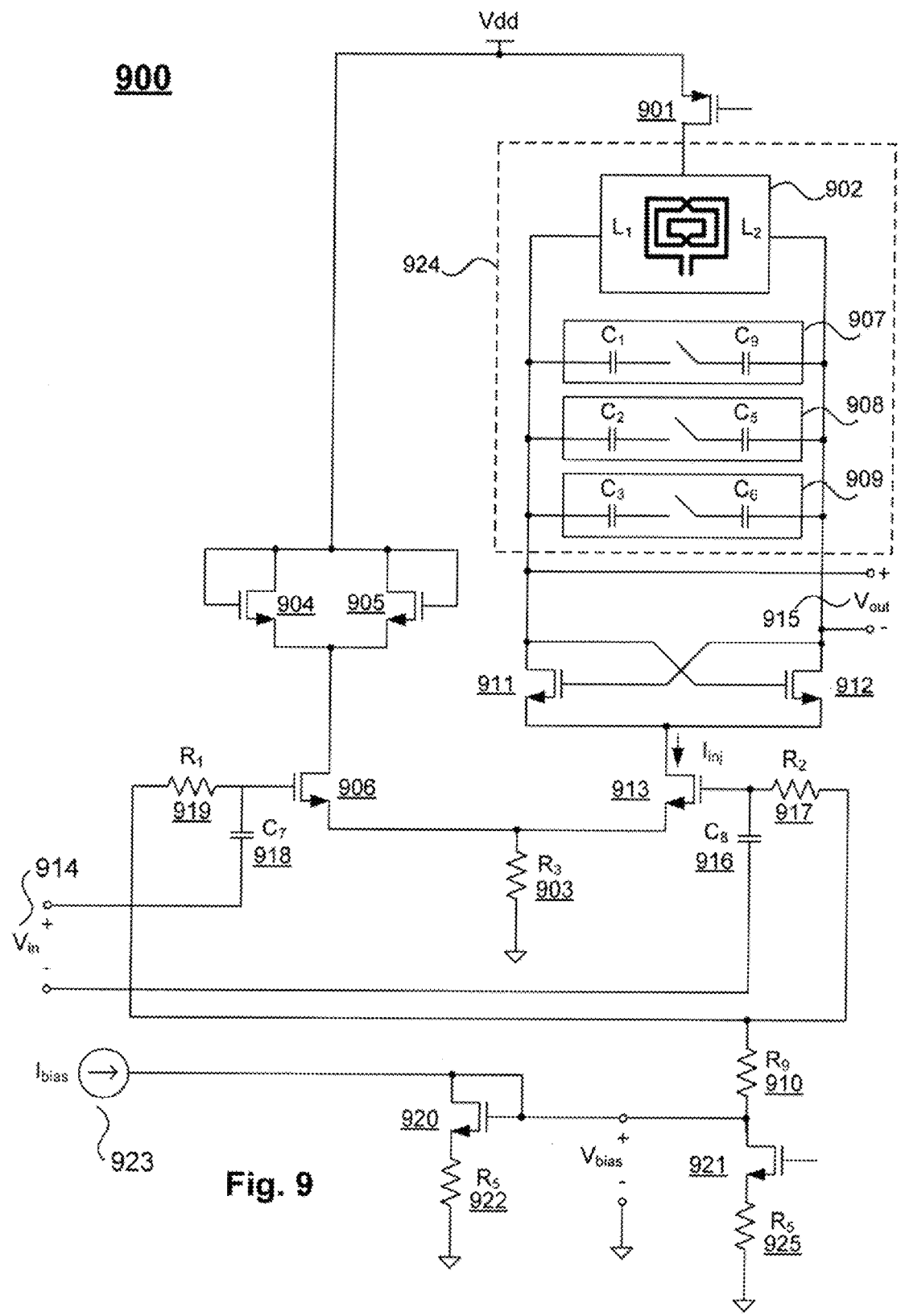
FIG. 9 illustrates a frequency divider according to one embodiment of the present invention.

FIG. 9 illustrates a frequency divider 900 according to another embodiment of the present invention. Frequency divider 900 utilizes a differential current injection circuit to produce differential output signal $V_{out}$ 915. Divider 900 includes a differential injection circuit including transistors 906 and 913. Transistor 906 is coupled to a load comprising transistors 904 and 905, which are NMOS transistors having their gates and drains coupled to a supply voltage Vdd. Transistor 913 is coupled to a load comprising an oscillator circuit. The differential injection circuit is biased using a resistor 903 coupled between the sources of transistors 906 and 913 and ground. Frequency divider 900 includes biasing circuitry for setting the operating point of the differential injection circuit. This biasing circuitry includes bias current source $I_{bias}$ 923, transistor 920, transistor 921, resistor 922, resistor 917, resistor 919, resistor 925, and resistor 910. $I_{bias}$ 923 is coupled to the drain terminal and the control terminal of transistor 920. The control terminal of transistor 920 is also coupled to one terminal of resistor 910 and the drain terminal of transistor 921. The source of transistor 920 is coupled through resistor 922 to set up a bias voltage $V_{bias}$ on resistor 910 and across transistor 921. Resistors 910 and 919 couple $V_{bias}$ to the control terminal of transistor 906. Resistors 910 and 917 couple $V_{bias}$ to the control terminal of transistor 913. The source terminal of transistor 921 is coupled through resistor 925 to ground. The gate transistor 921 is set to hold the bias value on resistor 910.

The differential resonant circuit 924, transistors 904-906, and transistors 911-913 operate in a similar manner to circuit 300 of FIG. 3A described above. Differential input signal $V_{in}$ 914 couples to the control terminal of transistor 906 through capacitor 918 and couples to the control terminal of transistor 913 through capacitor 916. Differential input signal $V_{in}$ 914 steers the current passing through resistor 903 from transistor 906 and transistor 913. Load balancing circuit comprised of transistors 904 and 905 is similar to the impedance as presented to the drain terminal of transistor 913. This load balancing circuit may improve the balance of current passing through transistors 906 and 913 such that each component of differential input signal $V_{in}$ 914 contributes proportionally to generating the injection current $I_{inj}$.

Differential resonant circuit 924 includes differential inductor 902 and selectable set of capacitors 907-909. Selectable sets of capacitors 907-909 may be chosen to change (i.e., tune) the frequency characteristics of the differential frequency divider. The differential inductor 902 has a first terminal coupled to the first terminal of each of selectable set of capacitors 907-909, the drain terminal of transistor 911, and the control terminal of transistor 912. The differential inductor 902 has a second terminal coupled to the second terminal of each of selectable set of capacitors 907-909, the drain terminal of transistor 912, and the control terminal of transistor 911. A center tap terminal of differential inductor 902 is coupled to Vdd through the channel of transistor 901. In this implementation, transistor 901 is a PMOS transistor operating in deep triode region to act as an impedance similar to the De-Qing resistor 307 of FIG. 3 described above.

Figure 10:
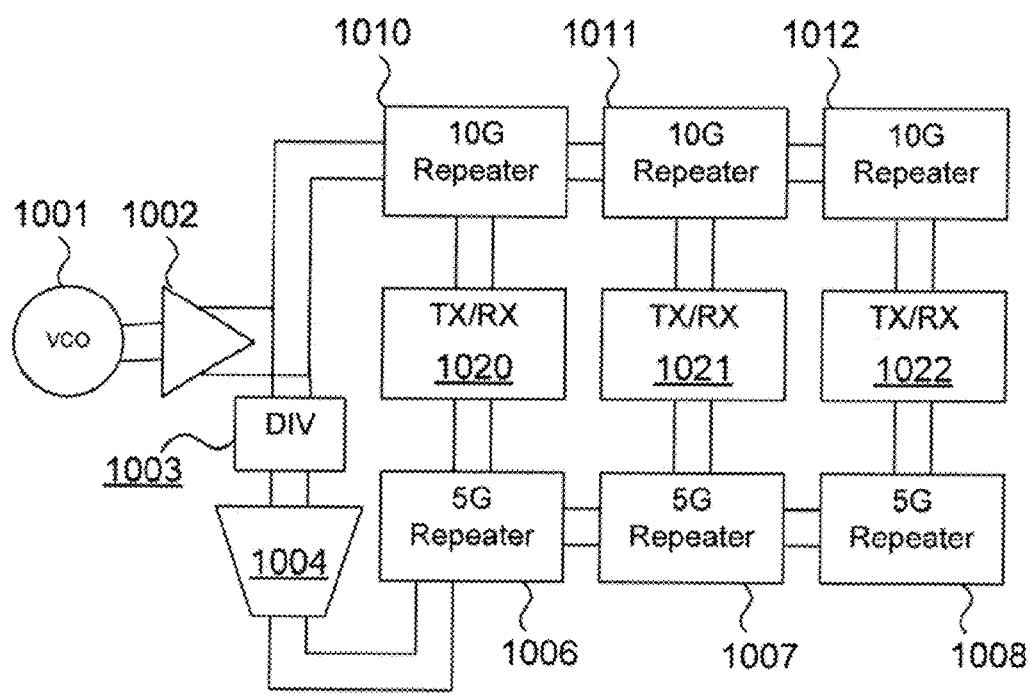
FIG. 10 illustrates a MIMO system with a distributed LO according to one embodiment of the present invention.

FIG. 10 illustrates a MIMO system with a distributed LO according to one embodiment of the present invention. Embodiments of the above described technique may be advantageously used in MIMO wireless integrated systems. For instance, because MIMO systems typically include several power amplifiers, it is important to overcome the common mode problems described above. In one embodiment, the present invention includes a MIMO architecture operable at multiple frequencies, which may use a divider described above. The MIMO system in FIG. 10 includes a voltage controlled oscillator ("VCO") 1001 for generating a local oscillator signal. The local oscillator signal may be used in the up-conversion process, the down-conversion process, or both, for example. In this example, the VCO may generate a local oscillator signal having a frequency of about 10 GHz, and the MIMO transceivers are operable at 5 GHz (e.g., 802.11a) and 2.4 GHz (802.11b/g). The VCO signal is generated at twice the operation frequency for transmission between different locations or points on an integrated circuit. Therefore, the signal used for 802.11a (5 GHz) is propagated at 10 GHz and the signal used for 802.11b/g (2.4 GHz) is propagated at about 5 GHz. The 10 GHz VCO output signal is coupled to a buffer 1002. In an actual implementation, in 802.11a mode the LO may range between about 10 and 12 GHz, while in 802.11b/g mode the LO may range between about 4.8 and 5GHz. The output of buffer 1002 is coupled to a plurality of 10G repeaters for receiving and passing on the signal to multiple transceivers when the transceivers are operating in 802.11a mode. For example, a first output of repeater 1010 is coupled to transceiver 1020 for providing an up/down conversion LO signal, and a second output is coupled to another repeater. In this manner, the 10 GHz LO signal may be provided to multiple transceivers (e.g., TX/RX 1021, TX/RX 1022, and others) in the MIMO system. The output of buffer 1002 is also coupled to a divider 1003. Divider 1003 may be a divide-by-two circuit implemented using any of the techniques described above and in FIGS. 2-4. The output of the divider 1003 is a 5 GHz signal, which is coupled to buffer 1004 and then to repeaters 1006-1008 to provide up/down conversion signals to transceivers 1020-1022 when the transceivers are operating in 802.11b or 802.11g mode. Inside each transceiver, the LO signals are divided by one-half so they can be used to send and receive information.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, while one example above illustrates a divide by 2, it is to be understood that common mode de-Qing is more general, and may be used whenever a differential inductor is used. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
an oscillator;
a load; and
a differential injection circuit having a differential input to receive a differential input signal having a first frequency, a first output coupled to the load to provide a load signal to the load that is based on a first component of the differential input signal, and a second output coupled to the oscillator to provide a first injection signal to the oscillator that is based on a second component of the differential input signal,
wherein:
a first impedance of the load is matched to a second impedance of the oscillator that corresponds to the second output effective to balance the first injection signal with the load signal to form a bias current coupled to the differential injection circuit,
the oscillator provides a differential output signal having a second frequency which is a fraction of the first frequency, and
the oscillator generates the differential output signal within the oscillator using the first injection signal.

2. The circuit of claim 1 wherein the second frequency is one-half the first frequency.

3. The circuit of claim 1 wherein the oscillator locks to a fractional frequency of the first injection signal.

4. The circuit of claim 1 further comprising a third impedance coupled between the oscillator and a reference voltage for reducing common-mode signal components at the output of the oscillator.

5. The circuit of claim 4 wherein the third impedance comprises a resistor.

6. The circuit of claim 4 wherein the third impedance comprises a transistor.

7. The circuit of claim 1 wherein the differential injection circuit comprises a first transistor and a second transistor, wherein a control terminal of the first transistor is configured to receive the first component of the differential input signal and a control terminal of the second transistor is configured to receive the second component of the differential input signal, and wherein a first terminal of the first transistor is coupled to a first terminal of the second transistor, and wherein a second terminal of the first transistor is coupled to the load and a second terminal of the second transistor is coupled to the oscillator.

8. The circuit of claim 1 wherein the oscillator comprises cross-coupled transistors each having a source coupled to the second output of the differential injection circuit to receive the first injection signal and a resonant circuit coupled to the cross-coupled circuit.

9. A method comprising:
receiving a differential input signal to be divided, the differential input signal having a first frequency;
converting the differential input signal into a load signal based on a first component of the differential input signal;
converting the differential input signal into an injection current having the first frequency based on a second component of the differential input signal;
providing the load signal to a load;
producing the injection current at an input of an oscillator, the injection current enabling the oscillator to generate a differential output signal that is based on the injection current and has a second frequency that is a fraction of the first frequency; and forming a bias current from the injection current and the load signal that are balanced using a first impedance of the load that is matched to a second impedance of the oscillator.

10. The method of claim 9 wherein the second frequency is one-half the first frequency.

11. The method of claim 9 wherein the oscillator locks to a fractional frequency of the injection current.

12. The method of claim 9 further comprising receiving a current from a reference voltage at the oscillator through a third impedance to dampen common mode frequency components and not dampen differential frequency components of the differential output signal.

13. The method of claim 12 wherein the third impedance is a resistor.

14. The method of claim 12 wherein the third impedance is a transistor.

15. A wireless communication system comprising:
a frequency synthesizer for generating a first local oscillator signal, the frequency synthesizer comprising:
an oscillator;
a load; and
a differential injection circuit having a differential input to receive a differential input signal having a first frequency, a first output coupled to the load to provide a load signal to the load that is based on a first component of the differential input signal, and a second output coupled to the oscillator to provide a first injection signal to the oscillator that is based on a second component of the differential input signal, wherein:
a first impedance of the load is matched to a second impedance of the oscillator that corresponds to the second output effective to balance the first injection signal with the load signal to form a bias current coupled to the differential injection circuit; and
the oscillator provides a differential output signal having a second frequency that is a fraction of the first frequency and generates the differential output signal within the oscillator using the first injection signal, at least a portion of the differential output signal provided by the oscillator corresponding to the first local oscillator signal;
a plurality of wireless transceivers, each transceiver comprising:
a wireless receiver comprising a down-converter, the down-converter receiving a first RF signal modulated at a third frequency and the first local oscillator signal, and in accordance therewith, producing a demodulated baseband signal; and
a wireless transmitter comprising an up-converter, the up-converter receiving a baseband signal and the first local oscillator signal, and in accordance therewith, producing a second RF signal modulated at the third frequency,
wherein the frequency synthesizer generates a second local oscillator signal for transmission across an integrated circuit, and wherein the second local oscillator signal is divided by a fractional value in each transceiver to said first frequency for use in down-converting said first RF signal and up-converting said baseband signal.

16. The wireless communication system of claim 15 wherein the one or more transceivers comprise multiple transceivers, and wherein each transceiver is operable in a first and second mode, and wherein the frequency synthesizer generates the first and second local oscillator signals having different frequencies, wherein in the first mode at least one transceiver transmits and receives RF signals using the first local oscillator signal, and wherein in the second mode the at least one transceiver transmits and receives RF signals using the second local oscillator signal.

17. The wireless communication system of claim 15, wherein the second frequency of the differential output signal is one-half the first frequency of the differential input signal.

18. The wireless communication system of claim 15, wherein the oscillator locks to a fractional frequency of the first injection signal.

19. The wireless communication system of claim 15, wherein the second impedance of the oscillator is configured to reduce common-mode signal components at the output of the oscillator.

20. The wireless communication system of claim 19, wherein the second impedance comprises a resistor.

21. The wireless communication system of claim 19, wherein the second impedance comprises a transistor.

22. The wireless communication system of claim 15 wherein the differential injection circuit comprises a first transistor and a second transistor, wherein a control terminal of the first transistor is configured to receive the first component of the differential input signal and a control terminal of the second transistor is configured to receive the second component of the differential input signal, and wherein a first terminal of the first transistor is coupled to a first terminal of the second transistor, and wherein a second terminal of the first transistor is coupled to the load and a second terminal of the second transistor is coupled to the oscillator.

23. The wireless communication system of claim 15, wherein the oscillator comprises cross-coupled transistors each having a source coupled to an output of the differential injection circuit to receive the first injection signal and an LC circuit coupled to the cross-coupled circuit.

* * * * *